(12) United States Patent
Suh et al.

(10) Patent No.: US 9,356,005 B2
(45) Date of Patent: May 31, 2016

(54) PACKAGE OF LIGHT EMITTING DIODE WITH HEAT SINK

(71) Applicant: RESEARCH & BUSINESS FOUNDATION SUNGKYUNKWAN UNIVERSITY, Suwon-si (KR)

(72) Inventors: Su-jeong Suh, Suwon-si (KR); Hwa-sun Park, Suwon-si (KR); Jung-kab Park, Gaya-eup (KR); Tae-yoo Kim, Suwon-si (KR); Young-lae Cho, Suwon-si (KR); Mi-ri Lee, Suwon-si (KR); Jin-ha Shin, Siheung-si (KR); Hwa-jin Son, Daegu (KR); Jung-woo Lee, Suwon-si (KR)

(73) Assignee: RESEARCH & BUSINESS FOUNDATION SUNGKYUNKWAN UNIVERSITY, Suwon-si (KR)

( * ) Notice: Subject to any disclaimer, the term of this patent is extended or adjusted under 35 U.S.C. 154(b) by 0 days.

(21) Appl. No.: 14/722,763

(22) Filed: May 27, 2015

(65) Prior Publication Data

US 2015/0348950 A1    Dec. 3, 2015

(30) Foreign Application Priority Data

May 29, 2014    (KR) .................. 10-2014-0064830

(51) Int. Cl.
*H01L 33/48* (2010.01)
*H01L 33/62* (2010.01)
*H01L 25/075* (2006.01)
*H01L 33/36* (2010.01)
*H01L 33/64* (2010.01)

(52) U.S. Cl.
CPC ............ *H01L 25/0753* (2013.01); *H01L 33/36* (2013.01); *H01L 33/62* (2013.01); *H01L 33/641* (2013.01); *H01L 33/647* (2013.01)

(58) Field of Classification Search
CPC ........ H01L 33/36; H01L 33/62; H01L 33/486
See application file for complete search history.

(56) References Cited

U.S. PATENT DOCUMENTS

| | | | | |
|---|---|---|---|---|
| 6,953,952 B2 * | 10/2005 | Asakawa | ............ | H01L 31/0203 257/100 |
| 7,045,905 B2 * | 5/2006 | Nakashima | ....... | H01L 23/49562 257/100 |
| 2006/0101757 A1 * | 5/2006 | Tsuzuki | .................. | H01L 33/60 52/405.3 |
| 2009/0179219 A1 * | 7/2009 | Kim | ...................... | H01L 33/486 257/99 |
| 2009/0315068 A1 * | 12/2009 | Oshio | ..................... | H01L 33/62 257/103 |

* cited by examiner

*Primary Examiner* — Thanh V Pham
(74) *Attorney, Agent, or Firm* — NSIP Law

(57) ABSTRACT

Disclosed herein is a light emitting diode (LED) package. The present invention is directed to a light emitting diode (LED) package capable of efficiently dissipating heat generated from LEDs. The present invention is also directed to a LED package in which a plurality of LEDs are disposed and heat generated from the plurality of LEDs is efficiently dissipated.

23 Claims, 30 Drawing Sheets

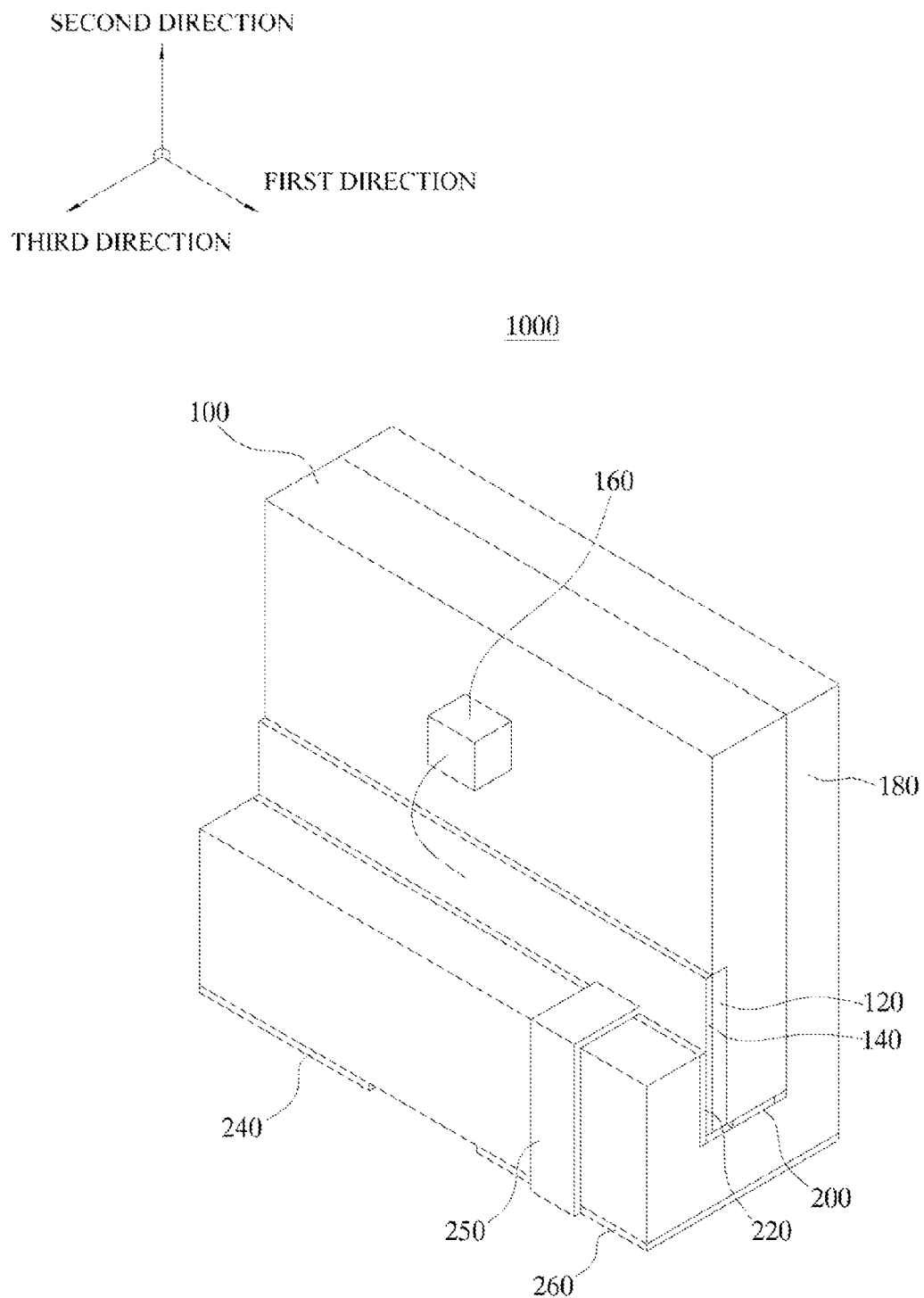

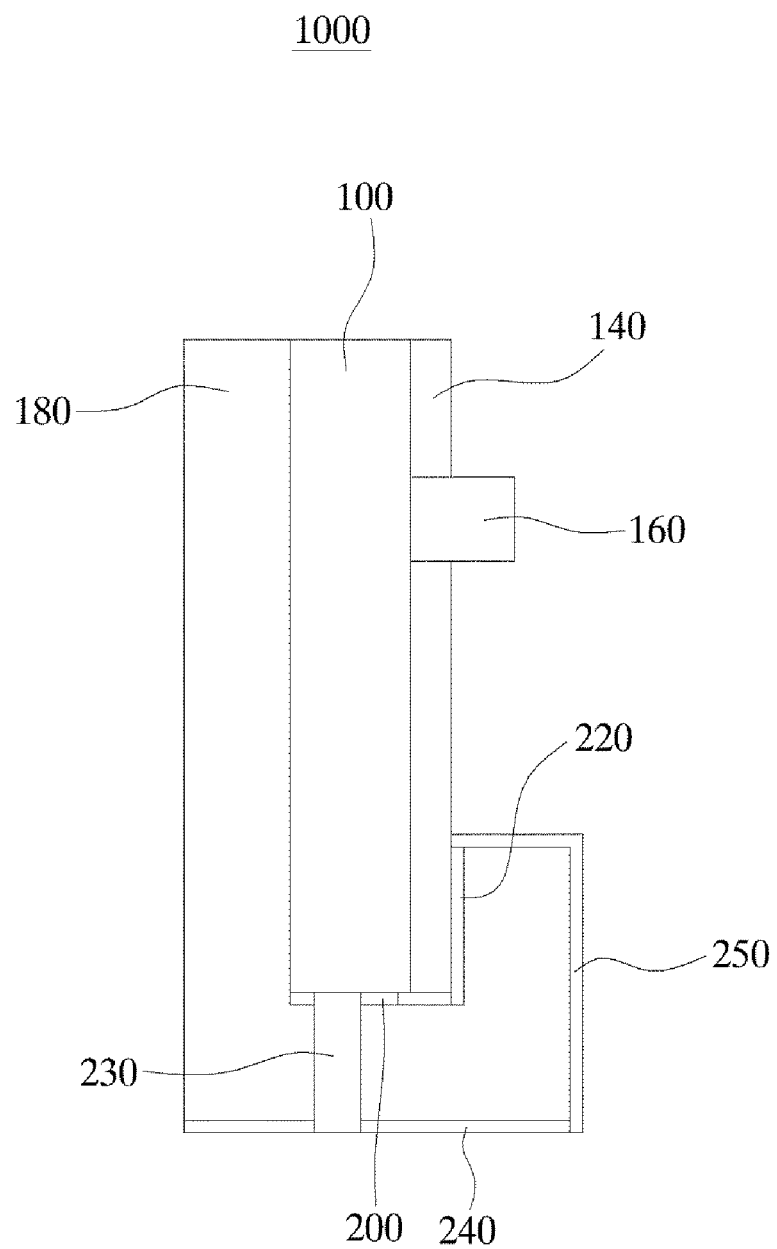

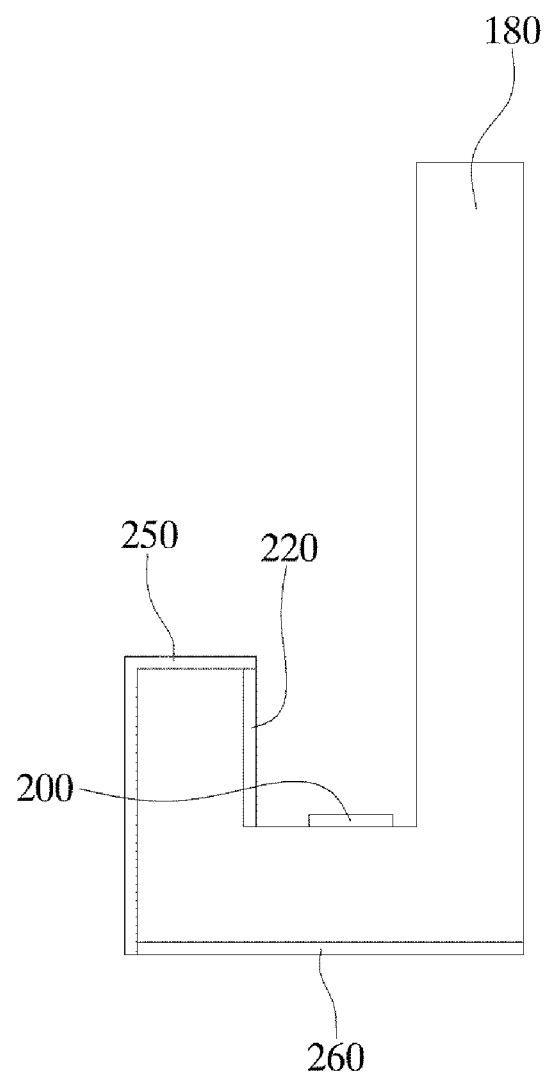

PACKAGE OF LIGHT EMITTING DIODE WITH HEAT SINK

CROSS-REFERENCE TO RELATED APPLICATION

This application claims the benefit under 35 USC 119(a) of Korean Patent Application No. 10-2014-0064830, filed on May 29, 2014, the entire disclosure of which is incorporated herein by reference for all purposes.

BACKGROUND

1. Field of the Invention

The present invention relates to a light emitting diode, and more particularly, to a side view light emitting diode package.

2. Discussion of Related Art

Currently, in view of environmental regulation and efficiency, a usage frequency of light emitting diodes (LEDs) among various light sources is being continuously increased domestically and globally. This is because the LEDs can generate light of high efficiency and high luminance compared with conventional light sources.

The LEDs generate light by a combination of electrons and holes, and heat is inevitably generated with the light. The LEDs emit about 20% of the provided energy as light energy, and the remainder, about 80%, as heat energy. Also, high performance LEDs generate heat having a high temperature, about 100 or greater, because of high power consumption. Thus, the high performance LEDs have a problem of generating heat greater than general LEDs.

When heat of the LEDs is not dissipated, devices may be damaged, the lifetime is decreased, and operation efficiency is decreased. In particular, in ultraviolet LEDs (UV LEDs), heat dissipation is more important because a great deal of heat is generated due to high power consumption.

Generally, LED packages are mainly classified into top type LED packages and side view LED packages. The side view LED packages are much used as light sources for backlights of display devices in which light is incident to a side surface of a light guide. Recently, the usage and application range of the side view LED packages have widened from the usage for the backlight of the conventional display.

The conventional side view LED package includes a cavity on the entire surface of a package body in which LEDs are mounted. Leads extend from an inside of the package body to the outside of the package body through a lower surface of the package body, and are electrically connected to the LED package in the cavity. Lead frames disposed in the package body are referred to as internal leads, and lead frames disposed outside of the package body are referred to as external leads. The external leads are bent under the lower surface of the package body and, for example, solder-connected to solder patterns of a substrate through a soldering method, and thus, the LED packages are mounted on the substrate and simultaneously electrically connected to the solder patterns on the substrate.

The above side view LED packages have a problem of vulnerability due to heat dissipation by a small area being in contact with the substrate compared with the top type LED packages, and the package body is formed of a polymer based plastic material, and thus, the heat of the LEDs is dissipated through the lead frames, thereby greatly decreasing efficiency of the heat dissipation.

SUMMARY OF THE INVENTION

The present invention is directed to a light emitting diode (LED) package capable of efficiently dissipating heat generated from LEDs.

The present invention is also directed to a LED package in which a plurality of LEDs are disposed and heat generated from the plurality of LEDs is efficiently dissipated.

According to one aspect of the present invention, there is provided an LED package including a light emitting device including a conductive substrate including an upper surface having a first plane and a second plane stepped from the first plane and having a length in a first direction and a width in a second direction perpendicular to the first direction, a first insulating layer formed on the first plane, a first electrode layer spaced apart from the second plane and disposed on the first insulating layer, and an LED disposed on the second plane and including a first electrode and a second electrode electrically connected to the first electrode layer and the conductive substrate, respectively; a heat sink formed by a first surface facing the first electrode layer, a second surface facing a lower surface of the conductive substrate, which faces the upper surface, and parallel with the first surface, and a bottom surface connecting the first surface to the second surface and having a length in the first direction and a width in the third direction perpendicular to the first direction, and including a receiving groove in which at least a portion of the light emitting device is inserted; a second electrode layer disposed on the bottom surface and being in contact with a side surface which connects the upper surface of the conductive substrate to the lower surface thereof to be electrically connected to the conductive substrate; and a third electrode layer disposed on the first surface and being in contact with the first electrode layer.

The LED diode package may further include a fourth electrode layer disposed on a lower surface of the heat sink which faces the bottom surface, and electrically connected to the second electrode layer; and a fifth electrode layer disposed on the lower surface of the heat sink while being spaced apart from the fourth electrode layer, and electrically connected to the third electrode layer.

The first plane may extend from a first edge of the upper surface of the conductive substrate along the second direction, and the second plane may extend from a second edge of the upper surface which faces the first edge along a direction opposite the second direction, and a width of the first plane along the first direction may be smaller than that of the second plane along the first direction.

The first plane may extend from a third edge of the upper surface of the conductive substrate along the first direction, and the second plane may extend from a fourth edge of the upper surface which faces the third edge in a direction opposite the first direction, and a width of the first plane along the first direction may be smaller than that of the second plane along the first direction.

One or more protrusions formed on a second surface of the receiving groove may be received in one or more grooves formed in a lower surface of the conductive substrate, and the lower surface of the conductive substrate may face the second surface of the receiving groove.

The LED diode package may further include an adhesive layer interposed between a second surface of the receiving groove and a lower surface of the conductive substrate, which couples the conductive substrate to the heat sink.

The second plane may protrude from the first plane.

The conductive substrate may include one or more materials selected from the group consisting of copper, aluminum, a copper alloy, and an aluminum alloy.

The first insulating layer may include an organic insulating material or an inorganic insulating material.

An area of the first insulating layer may be greater than that of the first electrode layer.

The second electrode layer may be disposed along the first direction, and an edge of the second electrode layer parallel with the third direction may be connected to an edge of the fourth electrode layer parallel with the third direction.

The third electrode layer may be disposed along the first direction, and an edge of the third electrode layer parallel with the first direction may be connected to an edge of the fifth electrode layer parallel with the first direction.

The third electrode layer may be disposed on a specific area of the first surface along the first direction, and an edge of the third electrode layer be parallel with the first direction is connected to an edge of the fifth electrode parallel with the first direction.

According to another aspect of the present invention, there is provided an LED package including a light emitting device including a conductive substrate including an upper surface having a first plane and a second plane stepped from the first plane and having a length in a first direction and a width in a second direction perpendicular to the first direction, a first insulating layer formed on the first plane, a first electrode layer spaced apart from the second plane and disposed on the first insulating layer, and a plurality of LEDs spaced apart from each other on the second plane along the first direction, and each including a first electrode and a second electrode electrically connected to the first electrode layer and the conductive substrate, respectively; a heat sink formed by a first surface facing the first electrode layer, a second surface facing a lower surface of the conductive substrate, which faces the upper surface, and parallel with the first surface, and a bottom surface connecting the first surface to the second surface and having a length in the first direction and a width in the third direction perpendicular to the first direction, and including a receiving groove into which at least a portion of the light emitting device is inserted; a second electrode layer disposed on the bottom surface and being in contact with a side surface which connects the upper surface of the conductive substrate to the lower surface thereof to be electrically connected to the conductive substrate; and a third electrode layer disposed on the first surface and being in contact with the first electrode layer.

The LED diode package may further include a fourth electrode layer disposed on a lower surface of the heat sink which faces the bottom surface, and electrically connected to the second electrode layer; and a fifth electrode layer disposed on the lower surface of the heat sink while being spaced apart from the fourth electrode layer, and electrically connected to the third electrode layer.

The first plane may extend from a first edge of the upper surface of the conductive substrate along the second direction, and the second plane may extend from a second edge of the upper surface which faces the first edge along a direction opposite the second direction, and a width of the first plane along the first direction may be smaller than that of the second plane along the first direction.

The second electrode layer may be disposed along the first direction, and an edge of the second electrode layer parallel with the third direction may be connected to an edge of the fourth electrode layer parallel with the third direction.

The third electrode layer may be disposed along the first direction, and an edge of the third electrode layer parallel with the first direction may be connected to an edge of the fifth electrode layer parallel with the first direction.

According to still another aspect of the present invention, there is provided an LED package including a light emitting device including a conductive substrate including an upper surface having a first plane and a second plane stepped from the first plane and having a length in a first direction and a width in a second direction perpendicular to the first direction, a first insulating layer formed on the first plane, a first electrode layer spaced apart from the second plane and disposed on the first insulating layer, and a plurality of LEDs spaced apart from each other on the second plane along the second direction, and each including a first electrode and a second electrode electrically connected to the first electrode layer and the conductive substrate, respectively; a heat sink formed by a first surface facing the first electrode layer, a second surface facing a lower surface of the conductive substrate, which faces the upper surface, and parallel with the first surface, and a bottom surface connecting the first surface to the second surface and having a length in the first direction and a width in the third direction perpendicular to the first direction, and including a receiving groove into which at least a portion of the light emitting device is inserted; a second electrode layer disposed on the bottom surface and being in contact with a side surface which connects the upper surface of the conductive substrate to the lower surface thereof to be electrically connected to the conductive substrate; and a third electrode layer disposed on the first surface and being in contact with the first electrode layer.

The LED diode package may further include a fourth electrode layer disposed on a lower surface of the heat sink which faces the bottom surface, and electrically connected to the second electrode layer; and a fifth electrode layer disposed on the lower surface of the heat sink while being spaced apart from the fourth electrode layer, and electrically connected to the third electrode layer.

The first plane may extend from a third edge of the upper surface of the conductive substrate along the first direction, and the second plane may extend from a fourth edge of the upper surface which faces the third edge along a direction opposite the first direction, and a width of the first plane along the first direction may be smaller than that of the second plane along the first direction.

The second electrode layer may be disposed along the first direction, and an edge of the second electrode layer parallel with the third direction may be connected to an edge of the fourth electrode layer parallel with the third direction.

The third electrode layer may be disposed along the first direction, and an edge of the third electrode layer parallel with the first direction may be connected to an edge of the fifth electrode layer parallel with the first direction.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which:

FIG. 1A is a perspective view illustrating a light emitting (LED) package according to an embodiment of the present invention;

FIG. 4D is a left side view illustrating the LED package shown in FIG. 4A;

FIG. 5E is a right side view illustrating a heat sink shown in FIG. 4A;

DETAILED DESCRIPTION OF EXEMPLARY EMBODIMENTS

Figure 1B:
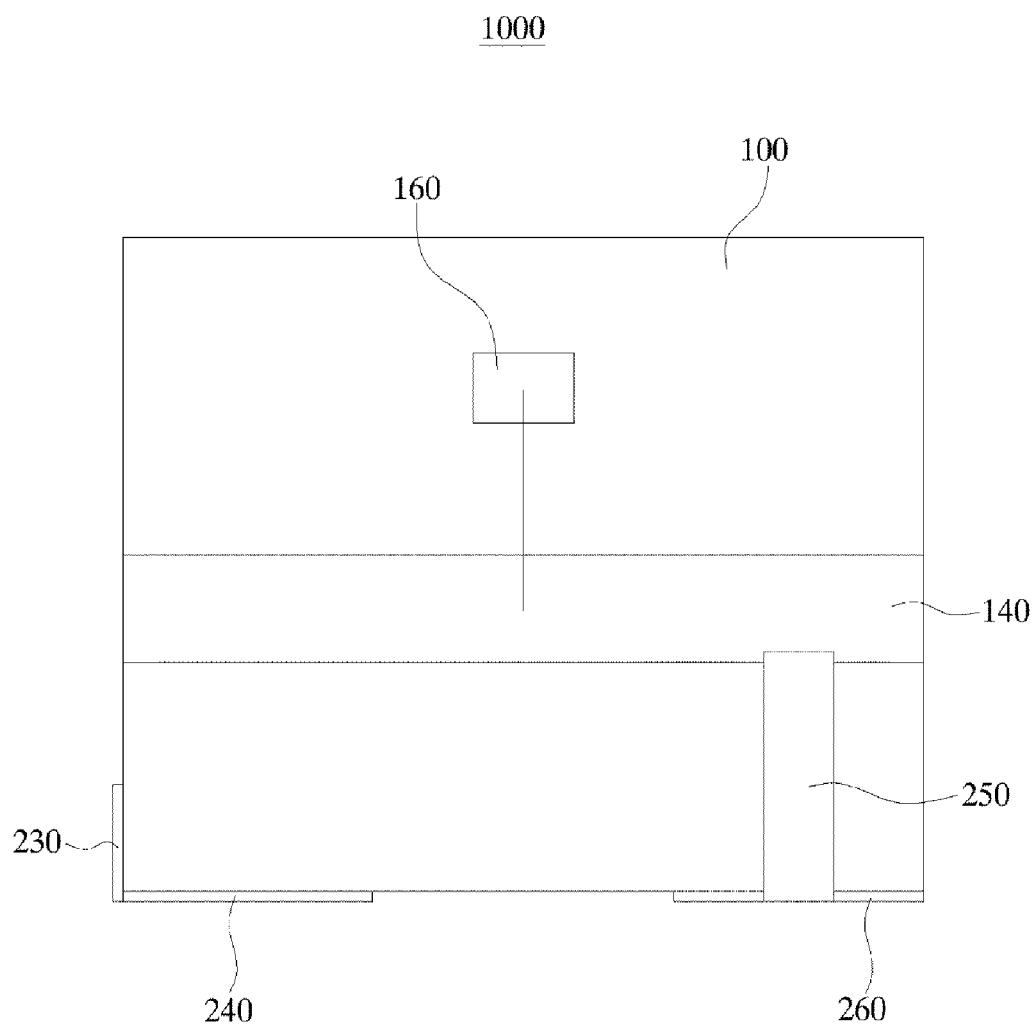
FIG. 1B is a front view illustrating the LED package shown in FIG. 1A.

It is important to understand that the present invention may be embodied in many alternative forms and should not be construed as limited to the example embodiments set forth herein. While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention.

Hereinafter, best modes of the present invention will be described in detail with reference to the accompanying drawings. In numbering reference numerals to the structural parts of each drawing, like numerals may refer to like elements throughout the description of the figures although the reference numerals are displayed in different drawings.

Figure 1C:
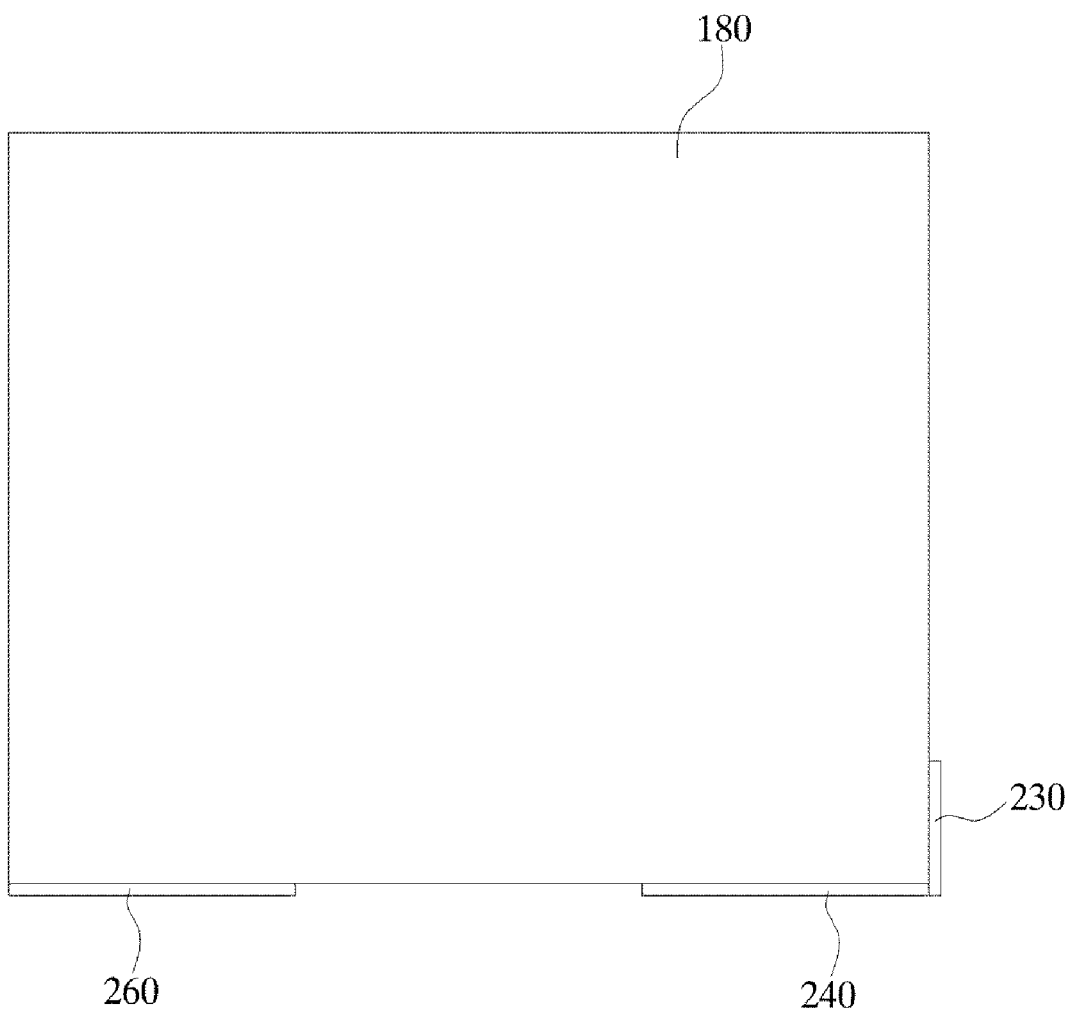
FIG. 1C is a rear view illustrating the LED package shown in FIG. 1A.
Figure 1D:
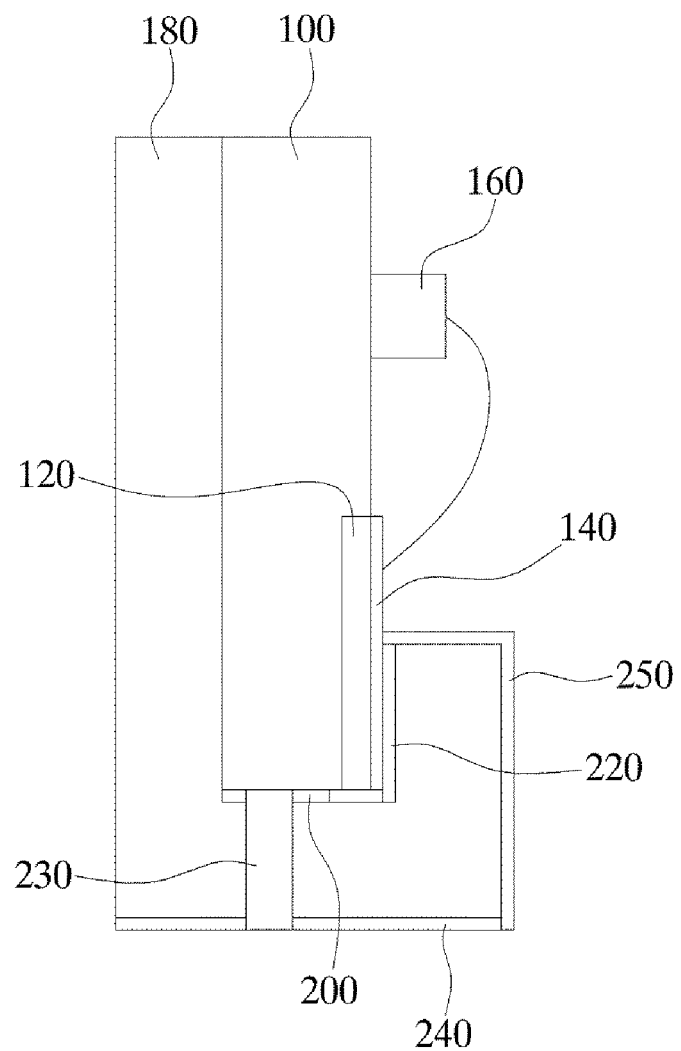
FIG. 1D is a left side view illustrating the LED package shown in FIG. 1A.
Figure 1E:
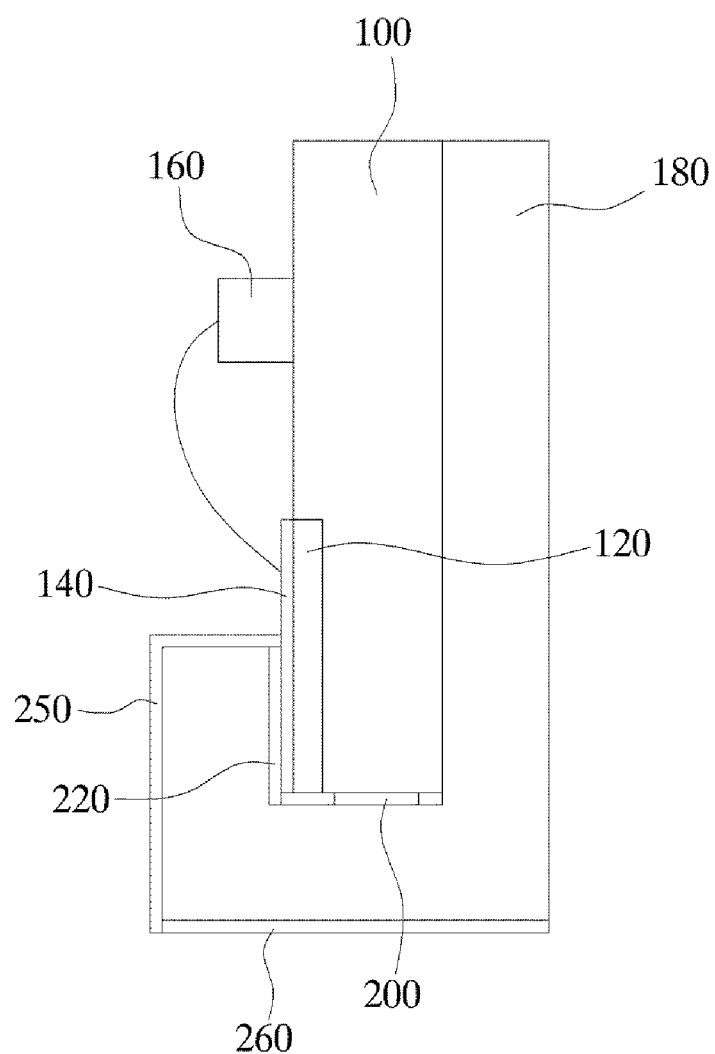
FIG. 1E is a right side view illustrating the LED package shown in FIG. 1A.
Figure 1F:
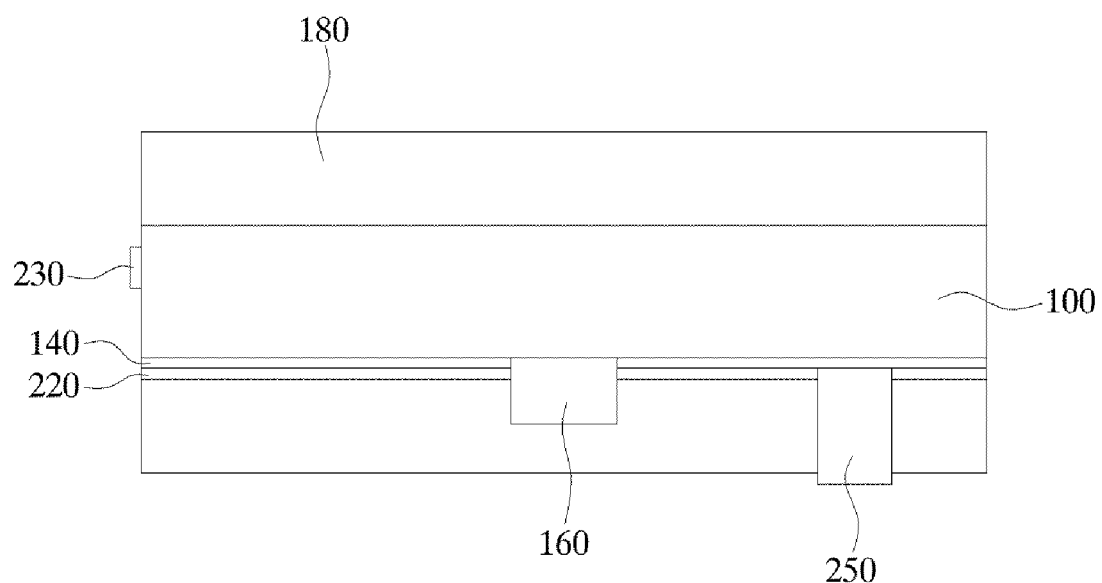
FIG. 1F is a plan view illustrating the LED package shown in FIG. 1A.
Figure 1G:
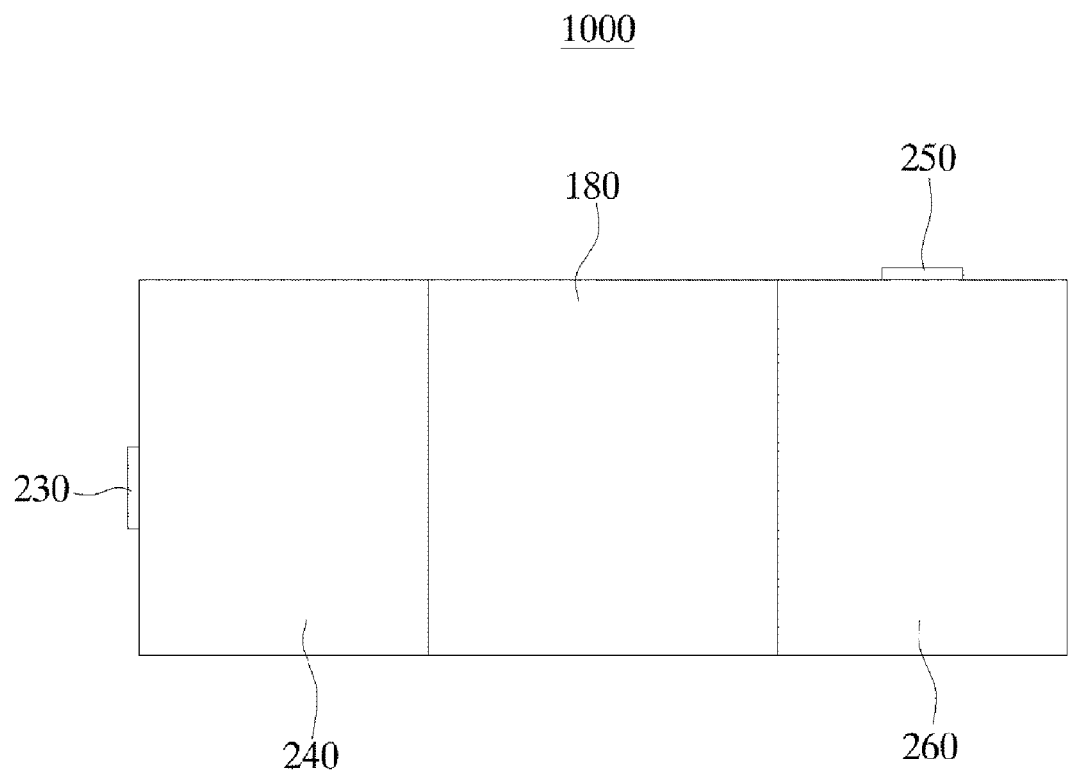
FIG. 1G is a bottom view illustrating the LED package shown in FIG. 1A.

FIG. 1A is a perspective view illustrating a light emitting (LED) package according to an embodiment of the present invention, FIG. 1B is a front view illustrating the LED package shown in FIG. 1A, FIG. 1C is a rear view illustrating the LED package shown in FIG. 1A, FIG. 1D is a left side view illustrating the LED package shown in FIG. 1A, FIG. 1E is a right side view illustrating the LED package shown in FIG. 1A, FIG. 1F is a plan view illustrating the LED package shown in FIG. 1A, and FIG. 1G is a bottom view illustrating the LED package shown in FIG. 1A.

Referring to FIGS. 1A to 1G a side view LED package 1000 according to the embodiment of the present invention may include a light emitting device, a heat sink 180, a second electrode layer 200, a third electrode layer 220, a first connection part 230, a fourth electrode layer 240, a second connection part 250, and a fifth electrode layer 260.

The light emitting device may include a conductive substrate 100, a first insulating layer 120, a first electrode layer 140, and an LED 160.

The conductive substrate 100 may include an upper surface having a first plane and a second plane stepped from the first plane, and the upper surface may have a length in a first direction and a width in a second direction perpendicular to the first direction.

The first plane may extend from a first edge of the upper surface of the conductive substrate 100 along the second direction, and the second plane may extend from a second edge of the upper surface facing the first edge along the second direction, and a width of the first plane may be smaller than that of the second plane. This is because the LED 160 is disposed on the second plane and an area larger than an area, in which the first electrode layer 140 is disposed, is needed.

For example, the conductive substrate 100 may be formed of at least one selected from the group consisting of copper, aluminum, a copper alloy, and an aluminum alloy. Gold (Au), silver (Ag), and/or the like which have excellent heat dissipation characteristics may also be used, but preferably the aluminum (Al), the aluminum alloy, the copper (Cu), the copper alloy, and/or the like may be used in consideration of economic efficiency.

The first insulating layer 120 may be formed on the first plane, and the first insulating layer 120 may electrically insulate the first electrode layer 140 from the conductive substrate 100. The first insulating layer 120 may be formed of an organic insulating material or an inorganic insulating material, for example, a thermosetting resin compound or a photosensitive resin compound.

The first electrode layer 140 may be spaced apart from the second plane, and disposed on the first insulating layer 120. Since the first insulating layer 120 and the first electrode layer 140 are disposed on the first plane, the second plane may protrude from the first plane, and the second plane may protrude from the upper surface of the conductive substrate 100 along a perpendicular direction. The first electrode layer 140 may be formed through an electroless plating or sputtering process.

For example, an area of the first insulating layer 120 may be greater than an area of the first electrode layer 140, and thus, the conductive substrate 100 may be spaced apart from the first electrode layer 140, thereby separating the conductive substrate 100 from the first electrode layer 140.

The LED 160 may be disposed on the second plane, and may include a first electrode (not shown) and a second electrode (not shown) electrically connected to the first electrode layer 140 and the second plane, respectively. For example, the first electrode of the LED 160 may be electrically connected to the first electrode layer 140 through wire bonding, and gold (Au), aluminum (Al), copper (Cu), and/or the like may be used for the wire bonding. Also, the second electrode of the LED 160 may be electrically connected to the second plane of the conductive substrate 100 through soldering bonding.

A receiving groove 182 may be formed in the heat sink 180, and the receiving groove 182 may be formed by a first surface facing the first electrode layer 140, a second surface facing a lower surface of the conductive substrate 100, which faces the upper surface of the conductive substrate 100, and parallel with the first surface, and a bottom surface connecting the first surface and the second surface and having a length in the first direction and a width in a third direction perpendicular to the first direction.

The bottom surface of the receiving groove 182 may have a length in the first direction and a width in the third direction perpendicular to the first direction. Since a portion of the light emitting device is received in the above receiving groove, the light emitting device may be coupled with the heat sink 180.

For example, the conductive substrate 100, the first insulating layer 120, and a portion of the first electrode layer 140 may be received in the receiving groove 182, and since the conductive substrate 100, the first insulating layer 120, and the portion of the first electrode layer 140 are received in the receiving groove 182 of the heat sink 180, the heat sink 180 may contact each of the conductive substrate 100, the first insulating layer 120, and the first electrode layer 140.

In order to insulate the heat sink 180, an insulating layer (not shown) may be formed on a surface of the heat sink 180. The insulating layer may be formed on the surface except specific areas, and the area without the insulating layer will be described below.

For example, the heat sink 180 may be formed of at least one material selected from the group consisting of copper, aluminum, a copper alloy, and an aluminum alloy. Gold (Au), silver (Ag), and/or the like which have excellent heat dissipation characteristics may also be used, but preferably the aluminum (Al), the aluminum alloy, the copper (Cu), the copper alloy, and/or the like may be used in consideration of economic efficiency.

The second electrode layer 200 may be disposed on the bottom surface of the receiving groove 182 of the heat sink 180, may contact the side surface of the conductive substrate 100 and may be electrically connected to the conductive substrate 100. To this end, the insulating layer may not be formed in a surface area of the heat sink 180 on which the second electrode layer 200 is disposed. For example, the second electrode layer 200 may be formed through an electroless plating or sputtering process.

The third electrode layer 220 may be disposed on the first surface of the receiving groove 182 of the heat sink 180, and may contact the first electrode layer 140 and may be electrically connected to the first electrode layer 140 while being spaced apart from the second electrode layer 200. To this end, the insulating layer may not be formed in a surface area of the heat sink 180 on which the third electrode layer 220 is disposed. For example, the third electrode layer 220 may be formed through an electroless plating or sputtering process.

Since a portion of the light emitting device is inserted into the heat sink 180, when the light emitting device is coupled with the heat sink 180, the lower surface of the conductive substrate 100 may face the second surface of the receiving groove 182.

Since the second surface of the receiving groove 182 contacts the lower surface of the conductive substrate 100, the heat generated from the LED 160 is transferred to the heat sink 180, and thus, a dissipating area may be increased. Thus, the heat generated from the LED 160 may be rapidly dissipated.

The fourth electrode layer 240 may be disposed on the lower surface of the heat sink 180, and electrically connected to the second electrode layer 200. To this end, the insulating layer may not be formed in a surface area of the heat sink 180 on which the fourth electrode layer 240 is disposed. For example, the fourth electrode layer 240 may be formed through an electroless plating or sputtering process.

The fifth electrode layer 260 may be disposed on the lower surface of the heat sink 180 while being spaced apart from the fourth electrode layer 240, and electrically connected to the third electrode layer 220. To this end, the insulating layer may not be formed in a surface area of the heat sink 180 on which the fifth electrode layer 260 is disposed. For example, the fifth electrode layer 260 may be formed through an electroless plating or sputtering process.

The fourth electrode layer 240 and the fifth electrode layer 260 of the side view LED package 1000 according to the embodiment of the present invention are electrode layers to be soldered on a printed circuit board (PCB) board, and may serve as an external lead of a conventional side view LED.

Figure 2A:
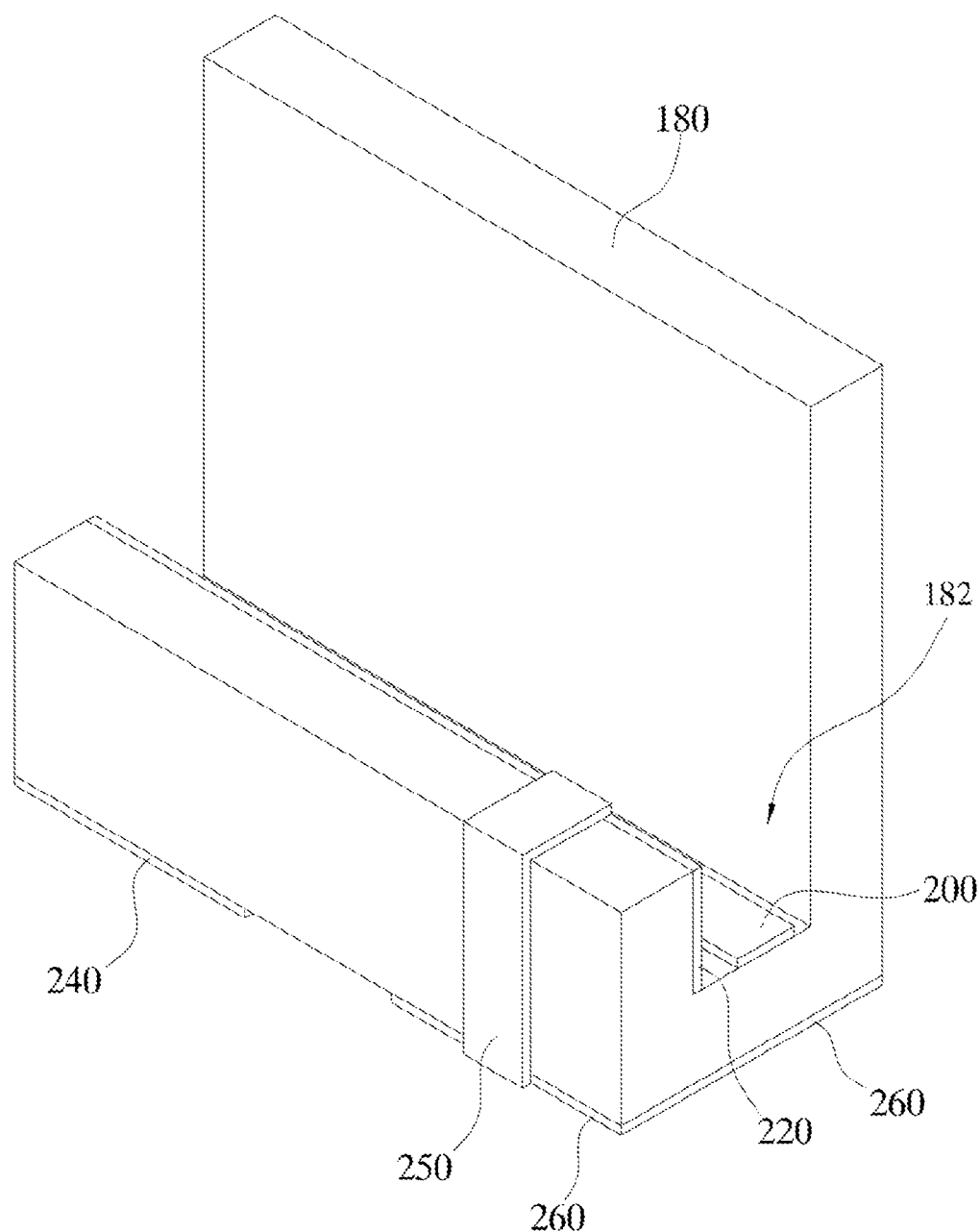
FIG. 2A is a perspective view illustrating a heat sink shown in FIG. 1A.
Figure 2B:
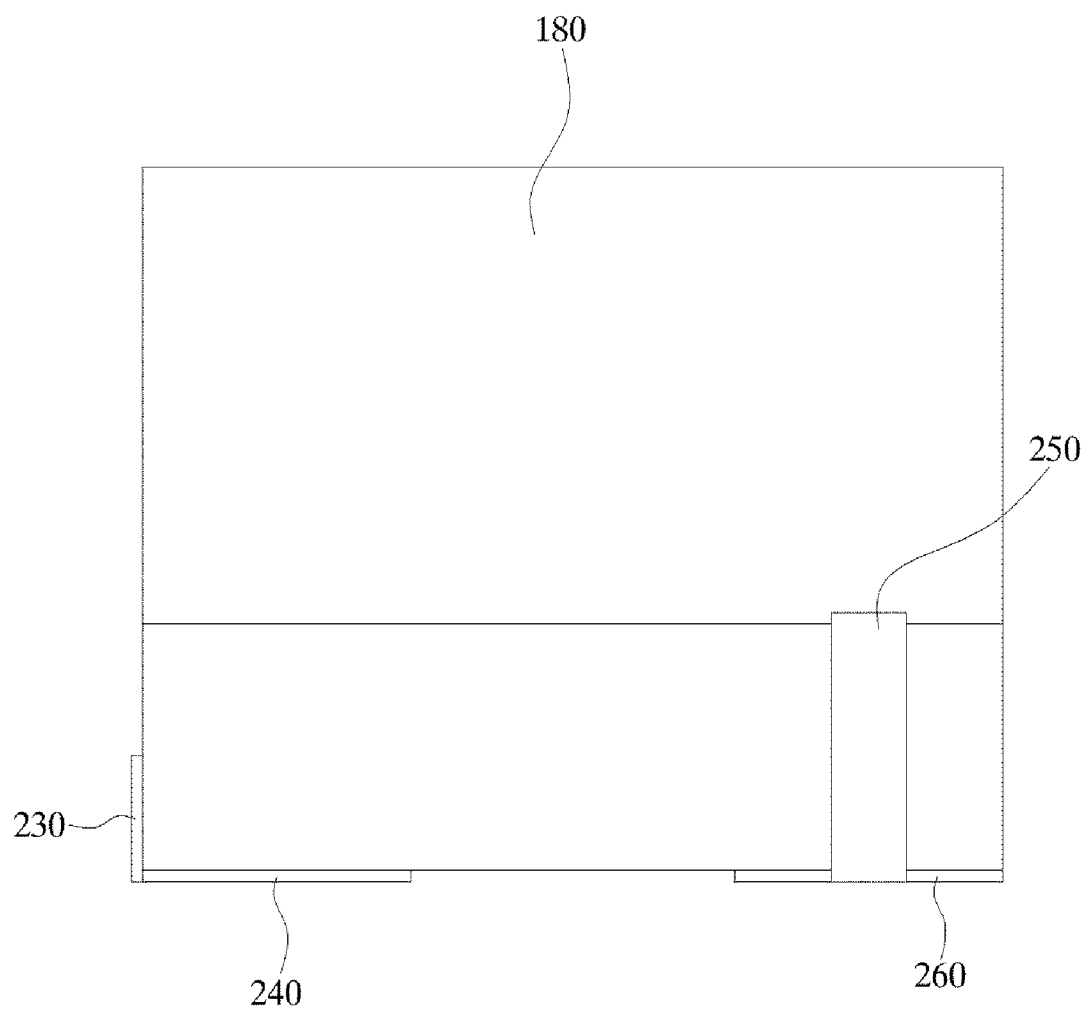
FIG. 2B is a front view illustrating a heat sink shown in FIG. 1A.
Figure 2C:
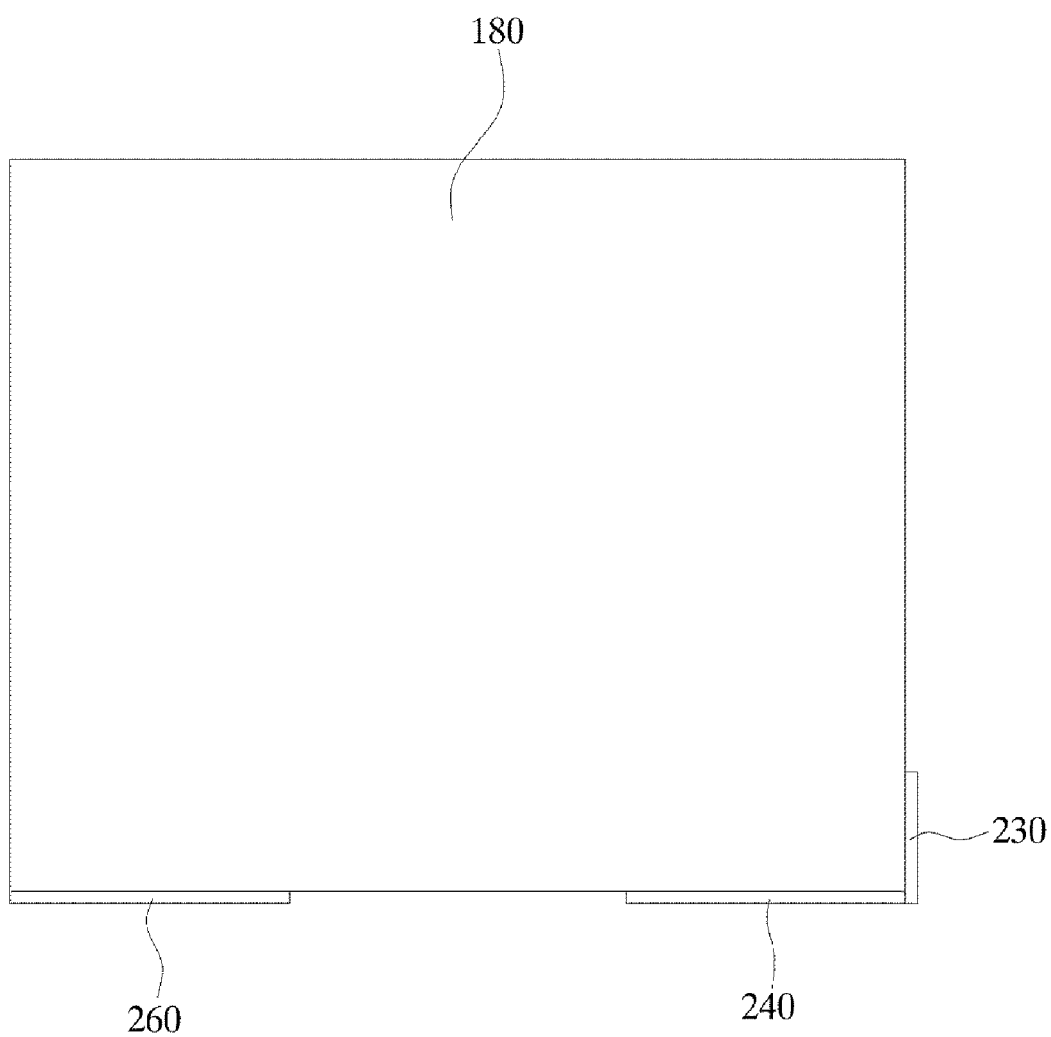
FIG. 2C is a rear view illustrating a heat sink shown in FIG. 1A.
Figure 2D:
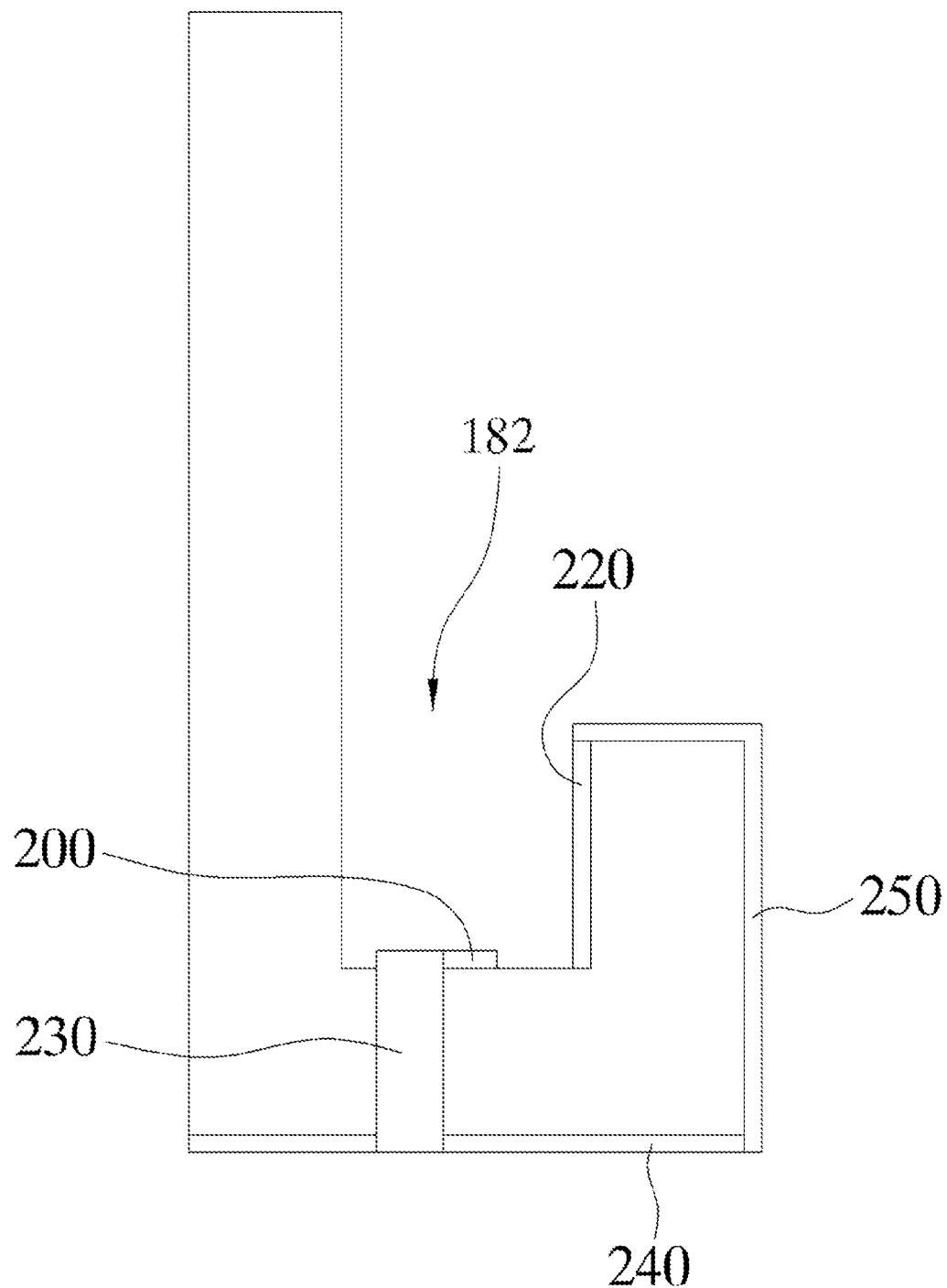
FIG. 2D is a left side view illustrating a heat sink shown in FIG. 1A.
Figure 2E:
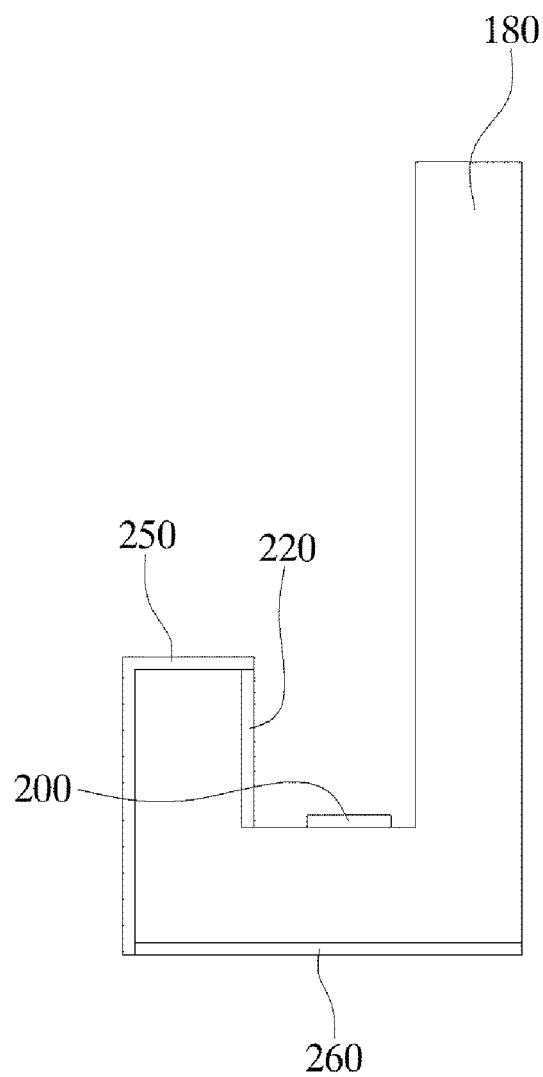
FIG. 2E is a right side view illustrating a heat sink shown in FIG. 1A.
Figure 2F:
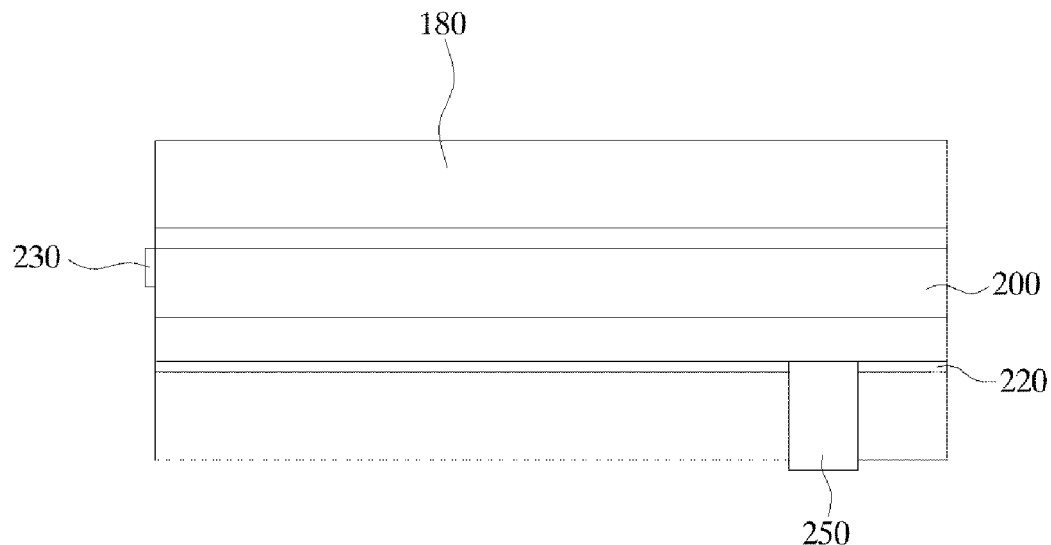
FIG. 2F is a plan view illustrating a heat sink shown in FIG. 1A.
Figure 2G:
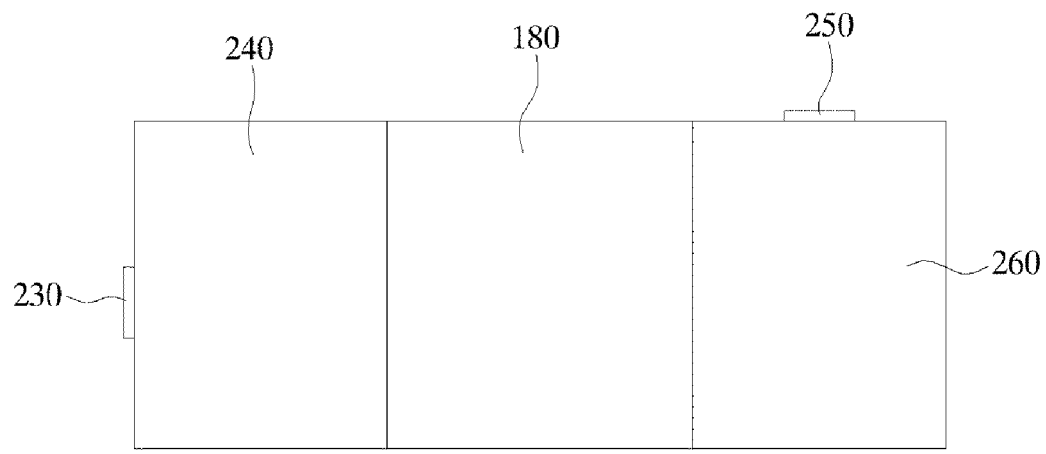
FIG. 2G is a bottom view illustrating a heat sink shown in FIG. 1A.

FIG. 2A is a perspective view illustrating a heat sink shown in FIG. 1A, FIG. 2B is a front view illustrating the heat sink shown in FIG. 1A, FIG. 2C is a rear view illustrating the heat sink shown in FIG. 1A, FIG. 2D is a left side view illustrating the heat sink shown in FIG. 1A, FIG. 2E is a right side view illustrating the heat sink shown in FIG. 1A, FIG. 2F is a plan view illustrating the heat sink shown in FIG. 1A, and FIG. 2G is a bottom view illustrating the heat sink shown in FIG. 1A.

Referring to FIGS. 2A to 2G, the second electrode layer 200 may be disposed on the bottom surface of the receiving groove 182 of the heat sink 180 along the first direction. The second electrode layer 200 may contact the side surface of the conductive substrate 100 and may be electrically connected to the conductive substrate 100.

An area of the second electrode layer 200 may be smaller than the bottom surface, this is because the second electrode layer 200 may be spaced apart from the third electrode layer 220, and thus, the second electrode layer 200 may be electrically insulated from the third electrode layer 220.

As described above, the bottom surface of the receiving groove 182 may have the length in the first direction and the width in the third direction perpendicular to the first direction, and an edge of the second electrode layer 200 parallel to the third direction may be connected to an edge of the fourth electrode layer 240 parallel with the third direction, and thus, the second electrode layer 200 may be electrically connected to the fourth electrode layer 240.

For example, since the first connection part 230 may contact the edge of the second electrode layer 200 and the edge of the fourth electrode layer 240, the second electrode layer 200 may be electrically connected to the fourth electrode layer 240. The first connection part 230 may be formed of the same material as the second electrode layer 200 and the fourth electrode layer 240, and may be simultaneously formed with the second electrode layer 200 and the fourth electrode layer 240 through a deposition process, an electric plating process, and/or the like.

The third electrode layer 220 may be disposed on the first surface of the receiving groove 182, may contact the first electrode layer 140 and may be electrically connected thereto while being spaced apart from the second electrode layer 200. The first surface of the receiving groove 182 may denote a surface facing the first electrode layer 140.

The third electrode layer 220 may be disposed along the first direction, and since an edge of the third electrode layer 220 parallel with the first direction is connected to the edge of the fifth electrode layer 260 parallel with the first direction, the third electrode layer 220 may be electrically connected to the fifth electrode layer 260.

For example, since the second connection part 250 may contact the edge of the third electrode layer 220 and the edge of the fifth electrode layer 260, the third electrode layer 220 may be electrically connected to the fifth electrode layer 260. The second connection part 250 may be formed of the same material as the third electrode layer 220 and the fifth electrode layer 260, and may be simultaneously formed with the third electrode layer 220 and the fifth electrode layer 260 through a deposition process, an electric plating process, and/or the like.

The connection between the second electrode layer 200 and the fourth electrode layer 240 and the connection between the third electrode layer 220 and the fifth electrode layer 260 are not limited to those described with reference to FIGS. 2A to 2G. That is, the connection may be performed by various methods while the second electrode layer 200 and the fourth electrode layer 240 are electrically insulated from the third electrode layer 220 and the fifth electrode layer 260, respectively.

Figure 3:
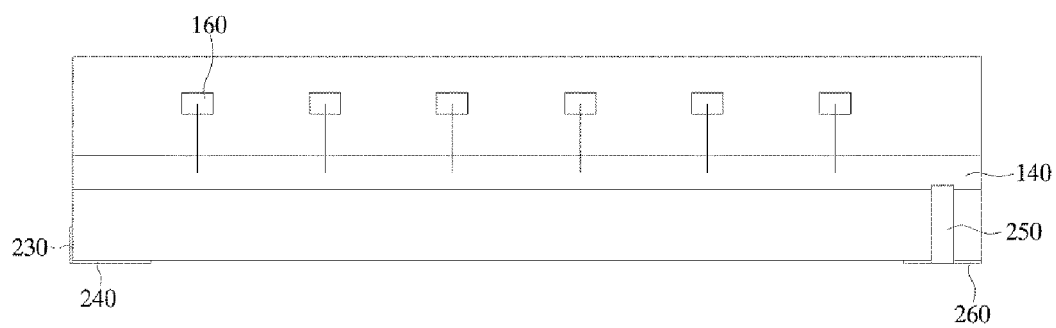
FIG. 3 is a view illustrating a state in which a plurality of LEDs are arranged on the LED package shown in FIG. 1A.

FIG. 3 is a view illustrating a state in which a plurality of LEDs are arranged on the LED package shown in FIG. 1A.

Referring to FIG. 3, a plurality of the LEDs 160 may be disposed on the second plane of the above-described conductive substrate 100 along the first direction while being spaced apart from each other.

Each of the plurality of LEDs 160 may include a first electrode and a second electrode. The plurality of LEDs 160 may be electrically connected to the first electrode layer 140 and the second plane through the first electrode and the second electrode, respectively.

For example, the first electrode of the LED 160 may be electrically connected to the first electrode layer 140 through wire bonding, and gold (Au), aluminum (Al), copper (Cu), and/or the like may be used in the wire bonding. Also, the second electrode of the LED 160 may be electrically connected to the second surface of the conductive substrate 100 through soldering bonding.

Figure 4A:
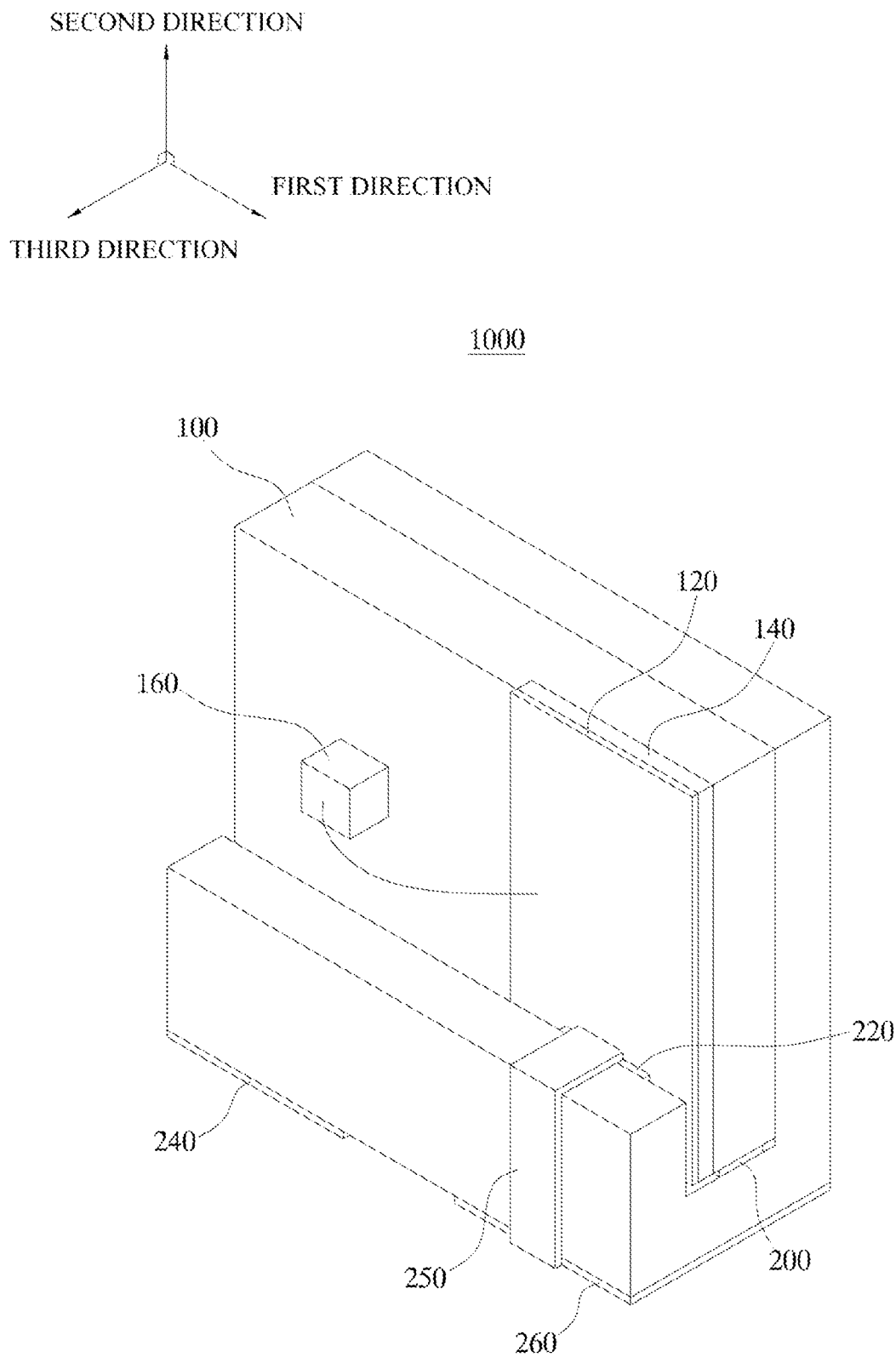
FIG. 4A is a perspective view illustrating an LED package according to another embodiment of the present invention.
Figure 4B:
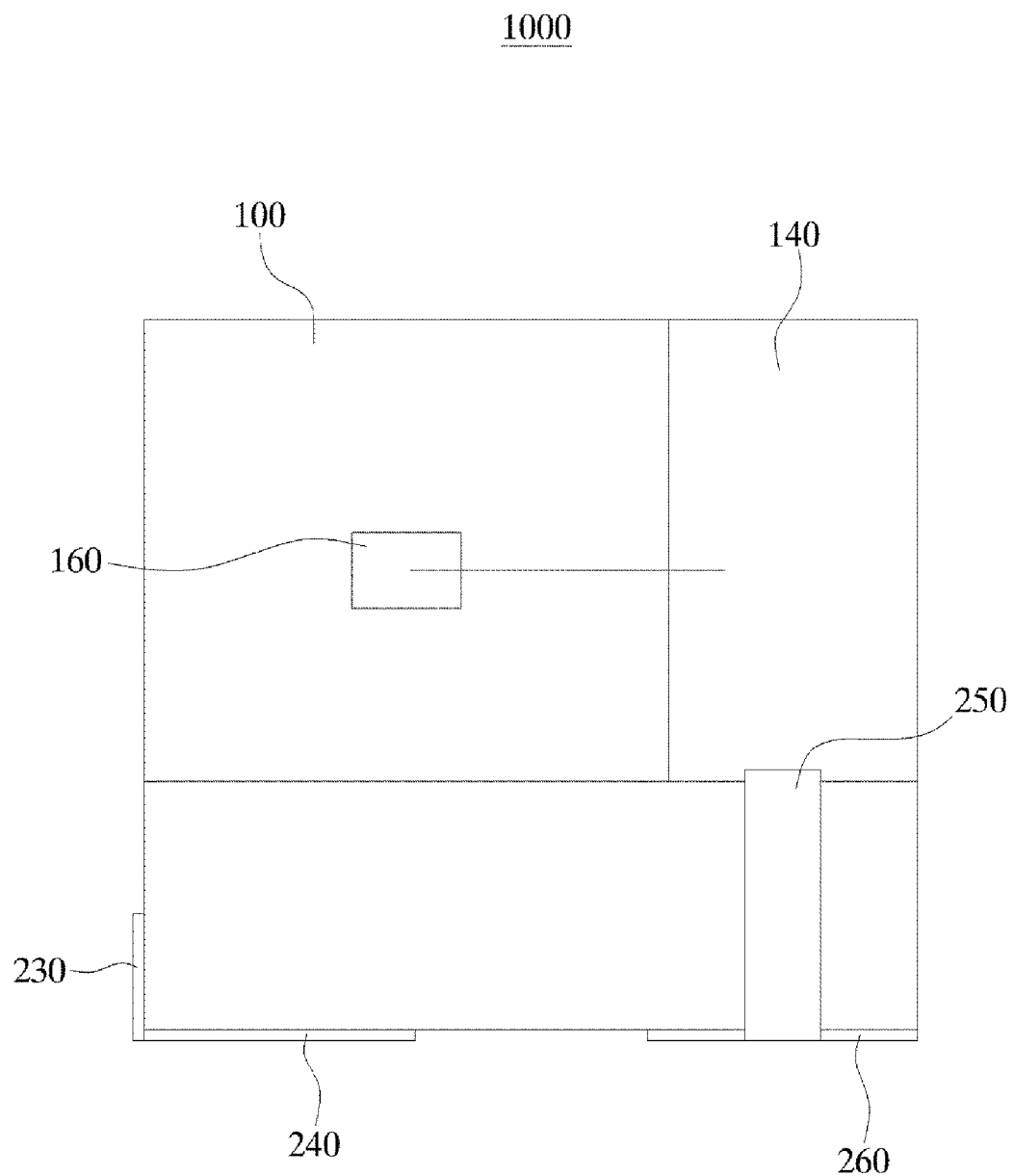
FIG. 4B is a front view illustrating the LED package shown in FIG. 4A.
Figure 4C:
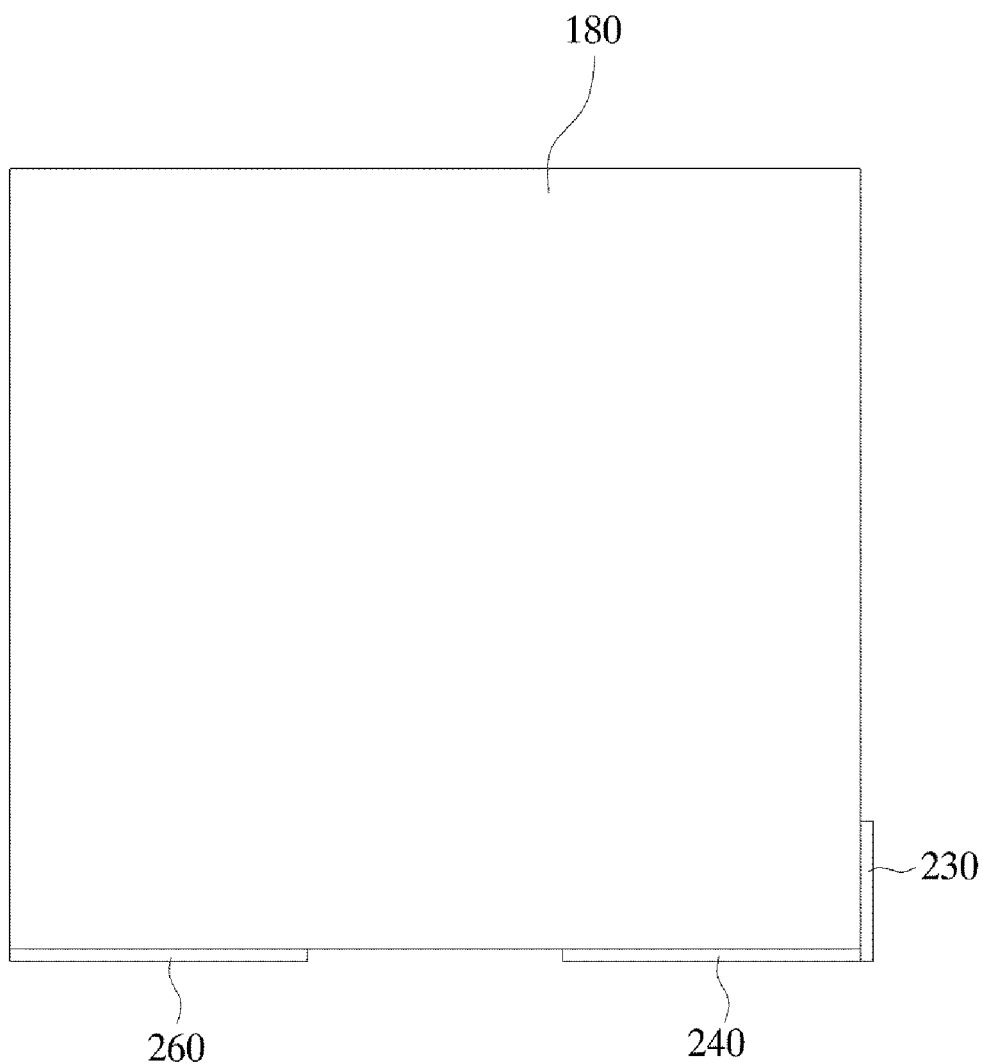
FIG. 4C is a rear view illustrating the LED package shown in FIG. 4A.
Figure 4E:
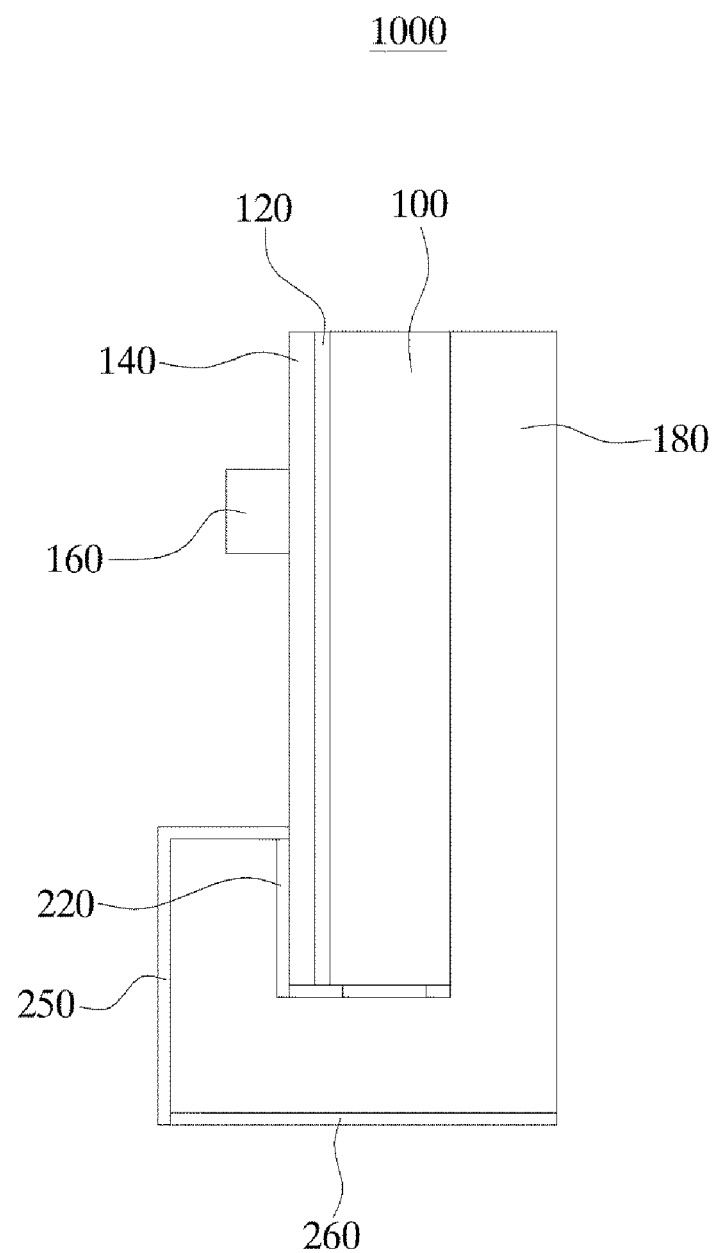
FIG. 4E is a right side view illustrating the LED package shown in FIG. 4A.
Figure 4F:
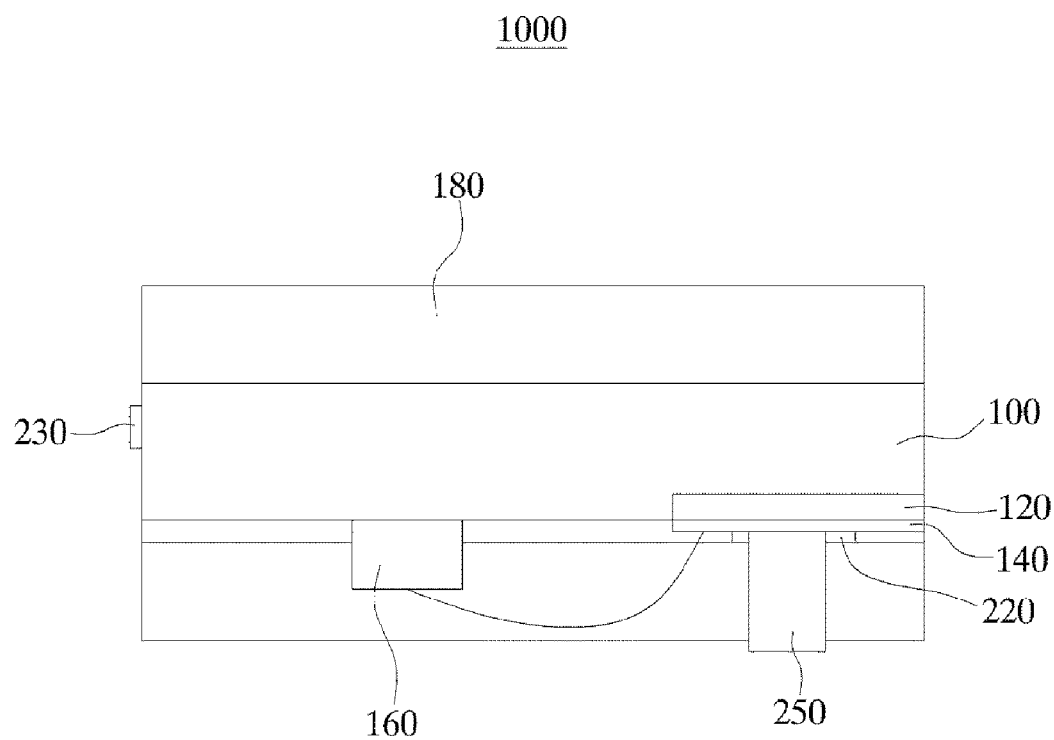
FIG. 4F is a plan view illustrating the LED package shown in FIG. 4A.
Figure 4G:
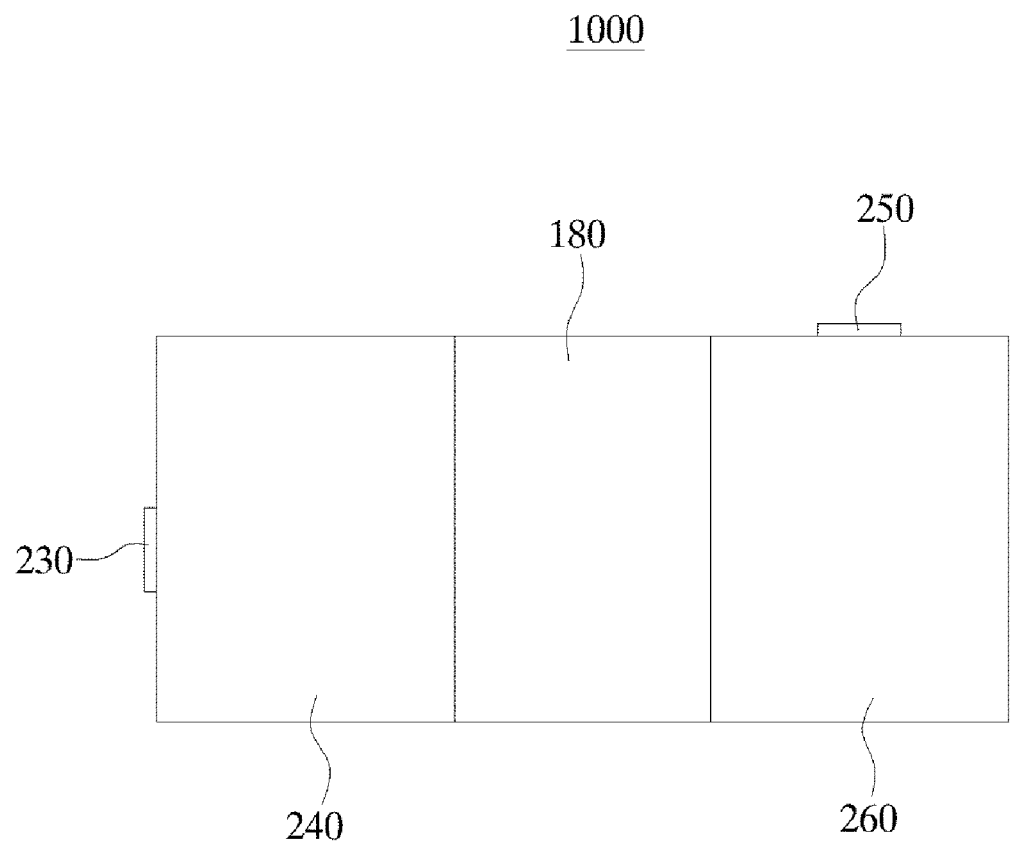
FIG. 4G is a bottom view illustrating the LED package shown in FIG. 4A.

FIG. 4A is a perspective view illustrating a light emitting (LED) package according to another embodiment of the present invention, FIG. 4B is a front view illustrating the LED package shown in FIG. 4A, FIG. 4C is a rear view illustrating the LED package shown in FIG. 4A, FIG. 4D is a left side view illustrating the LED package shown in FIG. 4A, FIG. 4E is a right side view illustrating the LED package shown in FIG. 4A, FIG. 4F is a plan view illustrating the LED package shown in FIG. 4A, and FIG. 4G is a bottom view illustrating the LED package shown in FIG. 4A.

Referring to FIGS. 4A to 4G a side view LED package 1000 according to the embodiment of the present invention may include a light emitting device, a heat sink 180, a second electrode layer 200, a third electrode layer 220, a first connection part 230, a fourth electrode layer 240, a second connection part 250, and a fifth electrode layer 260.

The light emitting device may include a conductive substrate 100, a first insulating layer 120, a first electrode layer 140, and an LED 160.

The conductive substrate 100 may include an upper surface having a first plane and a second plane stepped from the first plane, and the upper surface may have a length in a first direction and a width in a second direction perpendicular to the first direction.

The first plane may extend from a third edge of the upper surface of the conductive substrate 100 along the first direction, and the second plane may extend from a fourth edge of the upper surface facing the third edge along the first direction, and a width of the first plane may be smaller than that of the second plane. The light emitting device described in FIGS. 4A to 4G has a structure inserted in the heat sink 180 by rotation of the light emitting device described in FIGS. 1A to 1G by 90 degrees.

The first plane may extend from a first edge of the upper surface of the conductive substrate 100 along the second direction, and the second plane may extend from a second edge of the upper surface facing the first edge along the second direction, and a width of the first plane may be smaller than that of the second plane. This is because the LED 160 is disposed on the second surface, and thus, an area greater than an area, in which the first electrode layer 140 is disposed, is needed.

For example, the conductive substrate 100 may be formed of at least one selected from the group consisting of copper, aluminum, a copper alloy, and an aluminum alloy. Gold (Au), silver (Ag), and/or the like which have excellent heat dissipation characteristics may also be used, but preferably the aluminum (Al), the aluminum alloy, the copper (Cu), the copper alloy, and/or the like may be used in consideration of economic efficiency.

The first insulating layer 120 may be formed on the first plane, and the first insulating layer 120 may electrically insulate the first electrode layer 140 from the conductive substrate 100. The first insulating layer 120 may be formed of an organic insulating material or an inorganic insulating material, for example, a thermosetting resin compound or a photosensitive resin compound.

The first electrode layer 140 may be spaced apart from the second plane, and disposed on the first insulating layer 120. Since the first insulating layer 120 and the first electrode layer 140 are disposed on the first plane, the second plane may protrude from the first plane, and the second plane may protrude from the upper surface of the conductive substrate 100 along a perpendicular direction. The first electrode layer 140 may be formed through an electroless plating or sputtering process.

For example, an area of the first insulating layer 120 may be greater than an area of the first electrode layer 140, and thus, the conductive substrate 100 may be spaced apart from the first electrode layer 140, thereby separating the conductive substrate 100 from the first electrode layer 140.

The LED 160 may be disposed on the second plane, and may include a first electrode (not shown) and a second electrode (not shown) electrically connected to the first electrode layer 140 and the second plane, respectively. For example, the first electrode of the LED 160 may be electrically connected to the first electrode layer 140 through wire bonding, and gold (Au), aluminum (Al), copper (Cu), and/or the like may be used for the wire bonding. Also, the second electrode of the LED 160 may be electrically connected to the second plane of the conductive substrate 100 through soldering bonding.

A receiving groove 182 may be formed in the heat sink 180, and the receiving groove 182 may be formed by a first surface facing the first electrode layer 140, a second surface facing a lower surface of the conductive substrate 100, which faces the upper surface of the conductive substrate 100, and parallel with the first surface, and a bottom surface connecting the first surface and the second surface and having a length in the first direction and a width in a third direction perpendicular to the first direction.

The bottom surface of the receiving groove 182 may have a length in the first direction and a width in the third direction perpendicular to the first direction. Since a portion of the light emitting device is received in the above receiving groove, the light emitting device may be coupled with the heat sink 180.

For example, the conductive substrate 100, the first insulating layer 120, and a portion of the first electrode layer 140 may be received in the receiving groove 182, and since the conductive substrate 100, the first insulating layer 120, and the portion of the first electrode layer 140 are received in the receiving groove 182 of the heat sink 180, the heat sink 180 may contact each of the substrate 100, the first insulating layer 120, and the first electrode layer 140.

In order to insulate the heat sink 180, an insulating layer (not shown) may be formed on a surface of the heat sink 180. The insulating layer may be formed on the surface except specific areas, and the area without the insulating layer will be described below.

For example, the heat sink 180 may be formed of at least one material selected from the group consisting of copper, aluminum, a copper alloy, and an aluminum alloy. Gold (Au), silver (Ag), and/or the like which have excellent heat dissipation characteristics may also be used, but preferably the aluminum (Al), the aluminum alloy, the copper (Cu), the copper alloy, and/or the like may be used in consideration of economic efficiency.

The second electrode layer 200 may be disposed on the bottom surface of the receiving groove 182 of the heat sink 180, may contact the side surface of the conductive substrate 100 and may be electrically connected to the conductive substrate 100. To this end, the insulating layer may not be formed in a surface area of the heat sink 180 on which the second electrode layer 200 is disposed. For example, the second electrode layer 200 may be formed through an electroless plating or sputtering process.

The third electrode layer 220 may be disposed on the first surface of the receiving groove 182 of the heat sink 180, may contact the first electrode layer 140 and may be electrically connected to the first electrode layer 140 while being spaced apart from the second electrode layer 200. To this end, the insulating layer may not be formed in a surface area of the heat sink 180 on which the third electrode layer 220 is disposed. For example, the third electrode layer 220 may be formed through an electroless plating or sputtering process.

Since the second surface of the receiving groove 182 contacts the lower surface of the conductive substrate 100, the heat generated from the LED 160 is transferred to the heat sink 180, and thus, a dissipating area may be increased. Thus, the heat generated from the LED 160 may be rapidly dissipated.

The fourth electrode layer 240 may be disposed on the lower surface of the heat sink 180, and electrically connected to the second electrode layer 200. To this end, the insulating layer may not be formed in a surface area of the heat sink 180 on which the fourth electrode layer 240 is disposed. For example, the fourth electrode layer 240 may be formed through an electroless plating or sputtering process.

The fifth electrode layer 260 may be disposed on the lower surface of the heat sink 180 while being spaced apart from the fourth electrode layer 240, and electrically connected to the third electrode layer 220. To this end, the insulating layer may not be formed in a surface area of the heat sink 180 on which the fifth electrode layer 260 is disposed. For example, the fifth electrode layer 260 may be formed through an electroless plating or sputtering process.

The fourth electrode layer 240 and the fifth electrode layer 260 of the side view LED package 1000 according to the embodiment of the present invention are electrode layers to be soldered on a printed circuit board (PCB) board, and may serve as an external lead of a conventional side view LED.

Figure 5A:
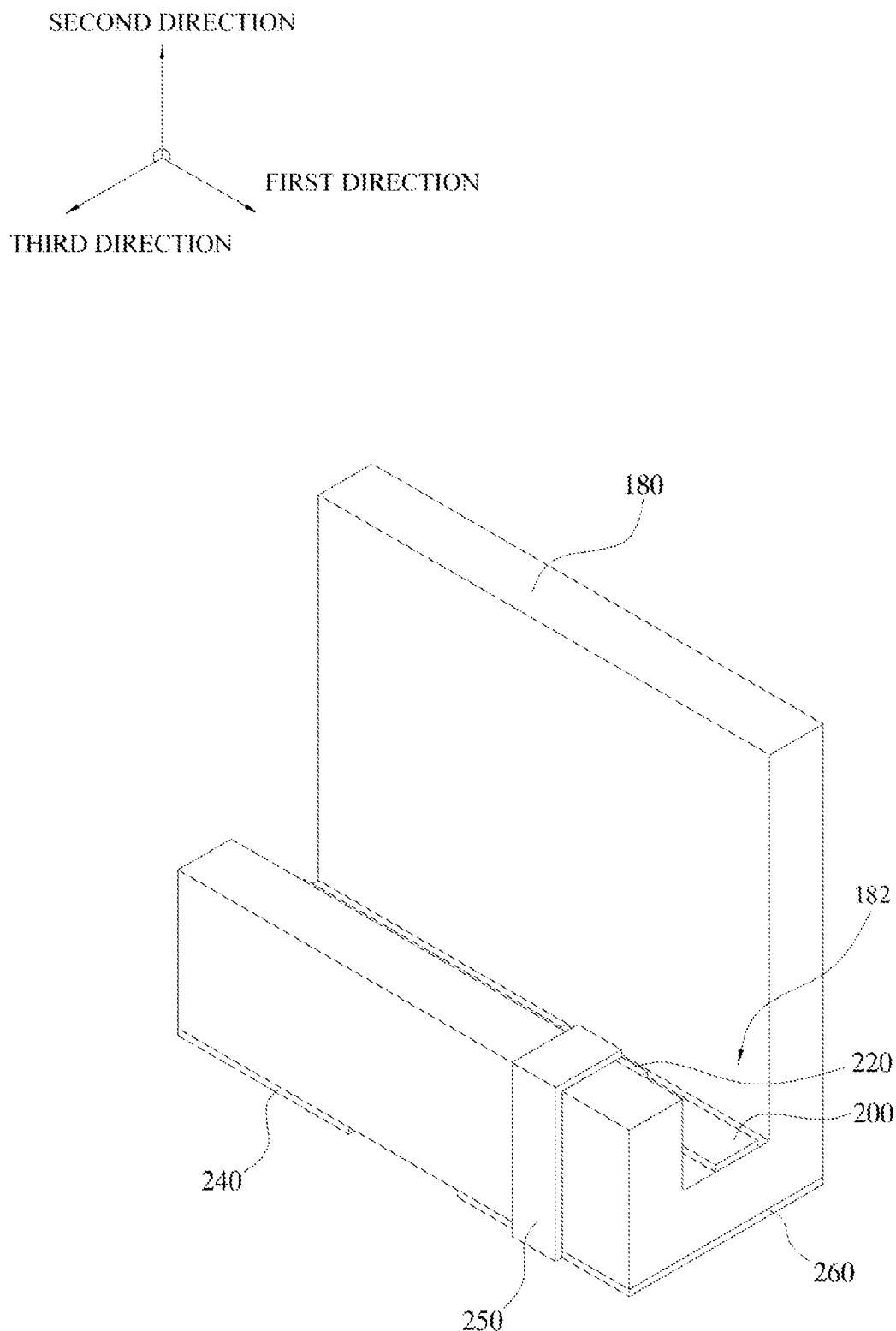
FIG. 5A is a perspective view illustrating a heat sink shown in FIG. 4A.
Figure 5B:
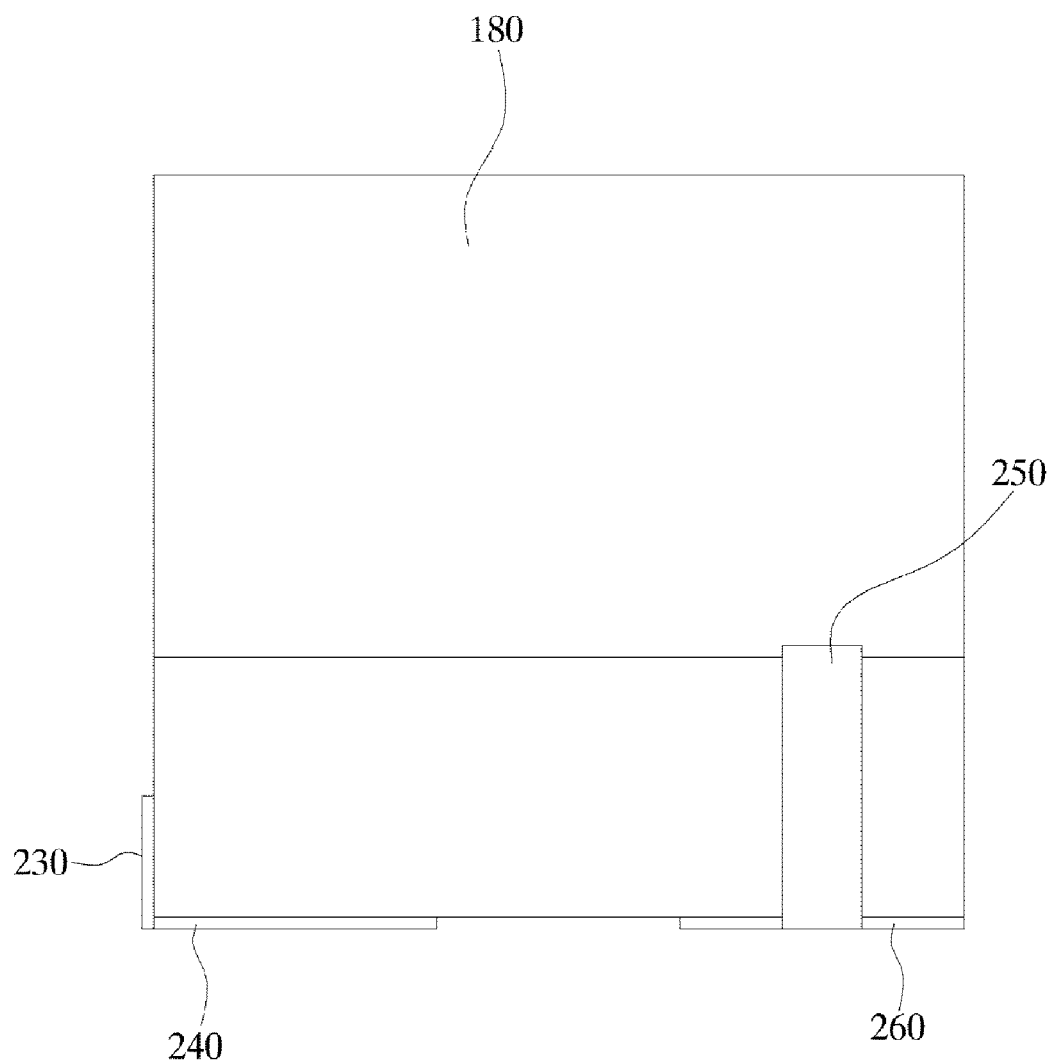
FIG. 5B is a front view illustrating a heat sink shown in FIG. 4A.
Figure 5C:
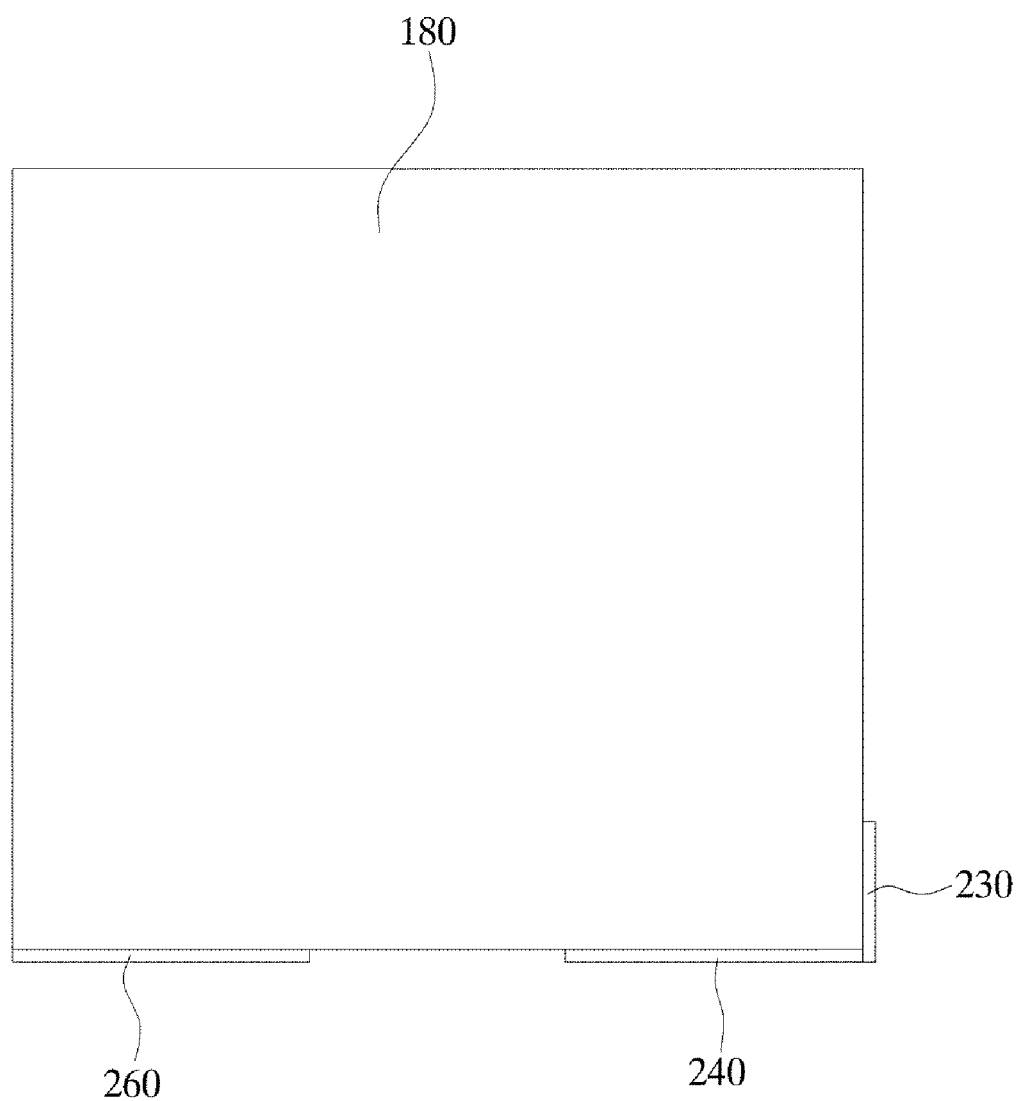
FIG. 5C is a rear view illustrating a heat sink shown in FIG. 4A.
Figure 5D:
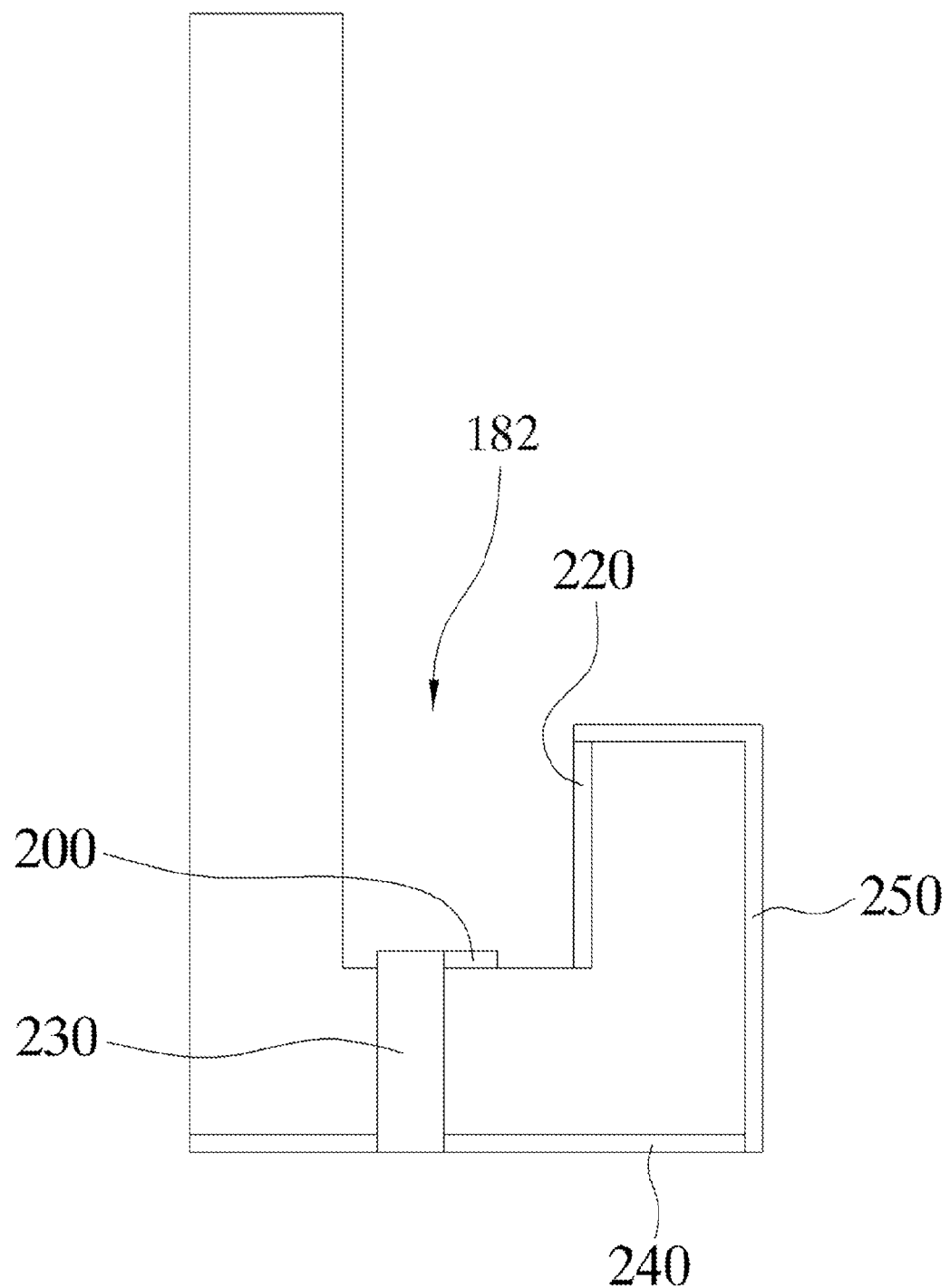
FIG. 5D is a left side view illustrating a heat sink shown in FIG. 4A.
Figure 5F:
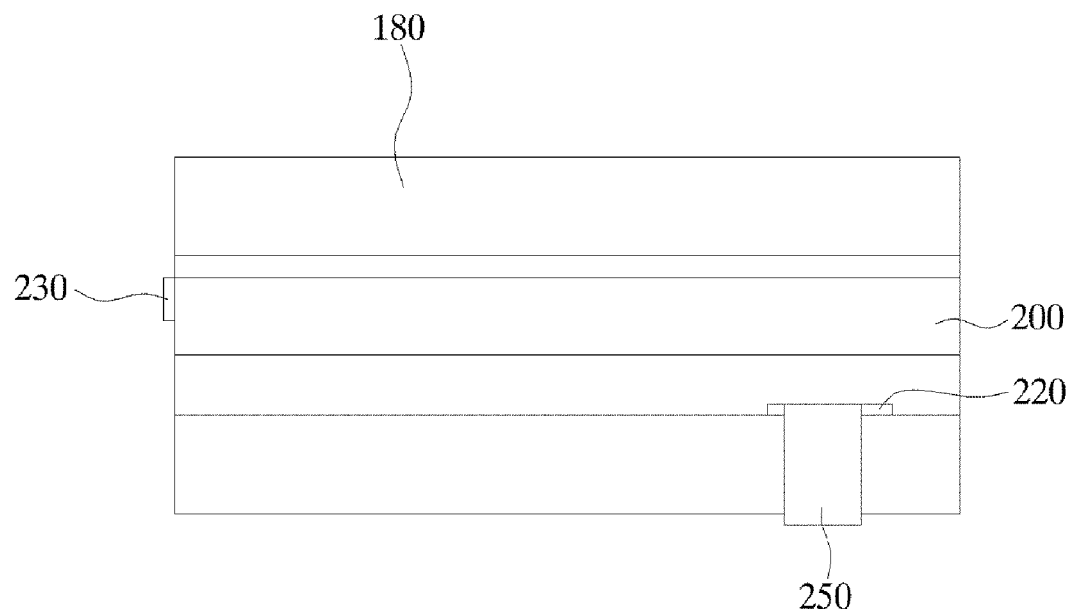
FIG. 5F is a plan view illustrating a heat sink shown in FIG. 4A.
Figure 5G:
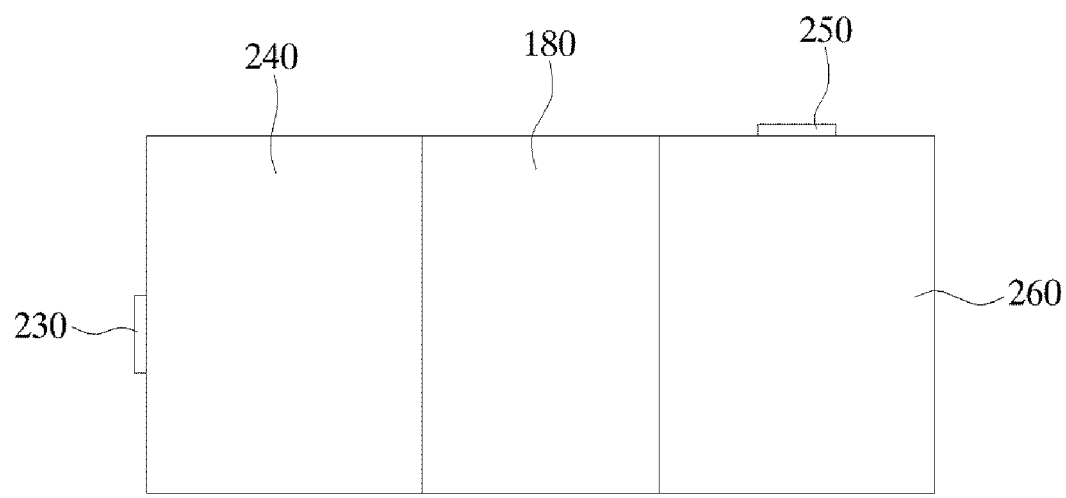
FIG. 5G is a bottom view illustrating a heat sink shown in FIG. 4A.

FIG. 5A is a perspective view illustrating a heat sink shown in FIG. 4A, FIG. 5B is a front view illustrating the heat sink shown in FIG. 4A, FIG. 5C is a rear view illustrating the heat sink shown in FIG. 4A, FIG. 5D is a left side view illustrating the heat sink shown in FIG. 4A, FIG. 5E is a right side view illustrating the heat sink shown in FIG. 4A, FIG. 5F is a plan view illustrating the heat sink shown in FIG. 4A, and FIG. 5G is a bottom view illustrating the heat sink shown in FIG. 4A.

Referring to FIGS. 5A to 5G, the second electrode layer 200 may be disposed on the bottom surface of the receiving groove 182 of the heat sink 180 along the first direction. The second electrode layer 200 may contact the side surface of the conductive substrate 100 and may be electrically connected to the conductive substrate 100.

An area of the second electrode layer 200 may be smaller than the bottom surface, and this is because the second electrode layer 200 may be spaced apart from the third electrode layer 220, and thus, the second electrode layer 200 may be electrically insulated from the third electrode layer 220.

As described above, the bottom surface of the receiving groove 182 may have the length in the first direction and the width in the third direction perpendicular to the first direction, and an edge of the second electrode layer 200 parallel to the third direction may be connected to an edge of the fourth electrode layer 240 parallel with the third direction, and thus, the second electrode layer 200 may be electrically connected to the fourth electrode layer 240.

The third electrode layer 220 may be disposed on a specific area of the first surface of the receiving groove 182, may contact the first electrode layer 140 and may be electrically connected thereto while being spaced apart from the second electrode layer 200. The first surface of the receiving groove 182 may denote a surface facing the first electrode layer 140.

An area in which the third electrode layer 220 is disposed may be spaced apart from the second surface of the conductive substrate 100, and the conductive substrate 100 may be electrically insulated from the third electrode layer 220 through the above.

The third electrode layer 220 may be disposed along the first direction, and since an edge of the third electrode layer 220 parallel with the first direction is connected to the edge of the fifth electrode layer 260 parallel with the first direction, the third electrode layer 220 may be electrically connected to the fifth electrode layer 260.

The connection between the second electrode layer 200 and the fourth electrode layer 240 and the connection between the third electrode layer 220 and the fifth electrode layer 260 are not limited to those described with reference to FIGS. 5A to 5G. That is, the connection may be performed by various methods while the second electrode layer 200 and the fourth electrode layer 240 are electrically insulated from the third electrode layer 220 and the fifth electrode layer 260, respectively. Hereinafter, any detailed description of contents the same as those described with reference to FIGS. 2A to 2G will be omitted.

Figure 6:
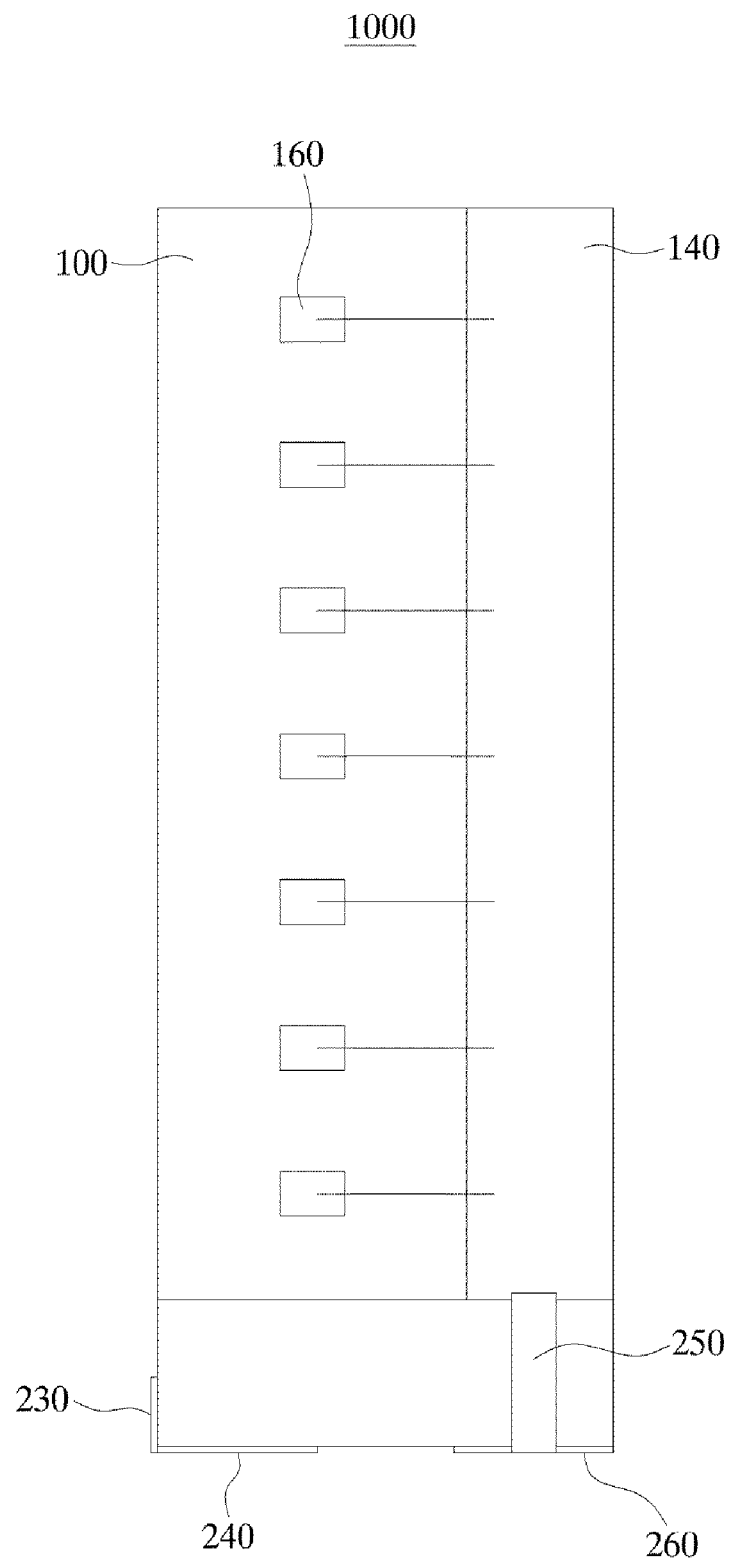
FIG. 6 is a view illustrating a state in which a plurality of LEDs are arranged on the LED package shown in FIG. 5A.

FIG. 6 is a view illustrating a state in which a plurality of LEDs are arranged on the LED package shown in FIG. 5A.

Referring to FIG. 6, a plurality of the LEDs 160 may be disposed on the second surface of the above-described conductive substrate 100 along the first direction while being spaced apart from each other.

Each of the plurality of LEDs 160 may include a first electrode and a second electrode. The plurality of LEDs 160 may be electrically connected to the first electrode layer 140 and the second surface through the first electrode and the second electrode, respectively.

For example, the first electrode of the LED 160 may be electrically connected to the first electrode layer 140 through wire bonding, and gold (Au), aluminum (Al), copper (Cu), and/or the like may be used in the wire bonding. Also, the second electrode of the LED 160 may be electrically connected to the second surface of the conductive substrate 100 through soldering bonding.

Figure 7A:
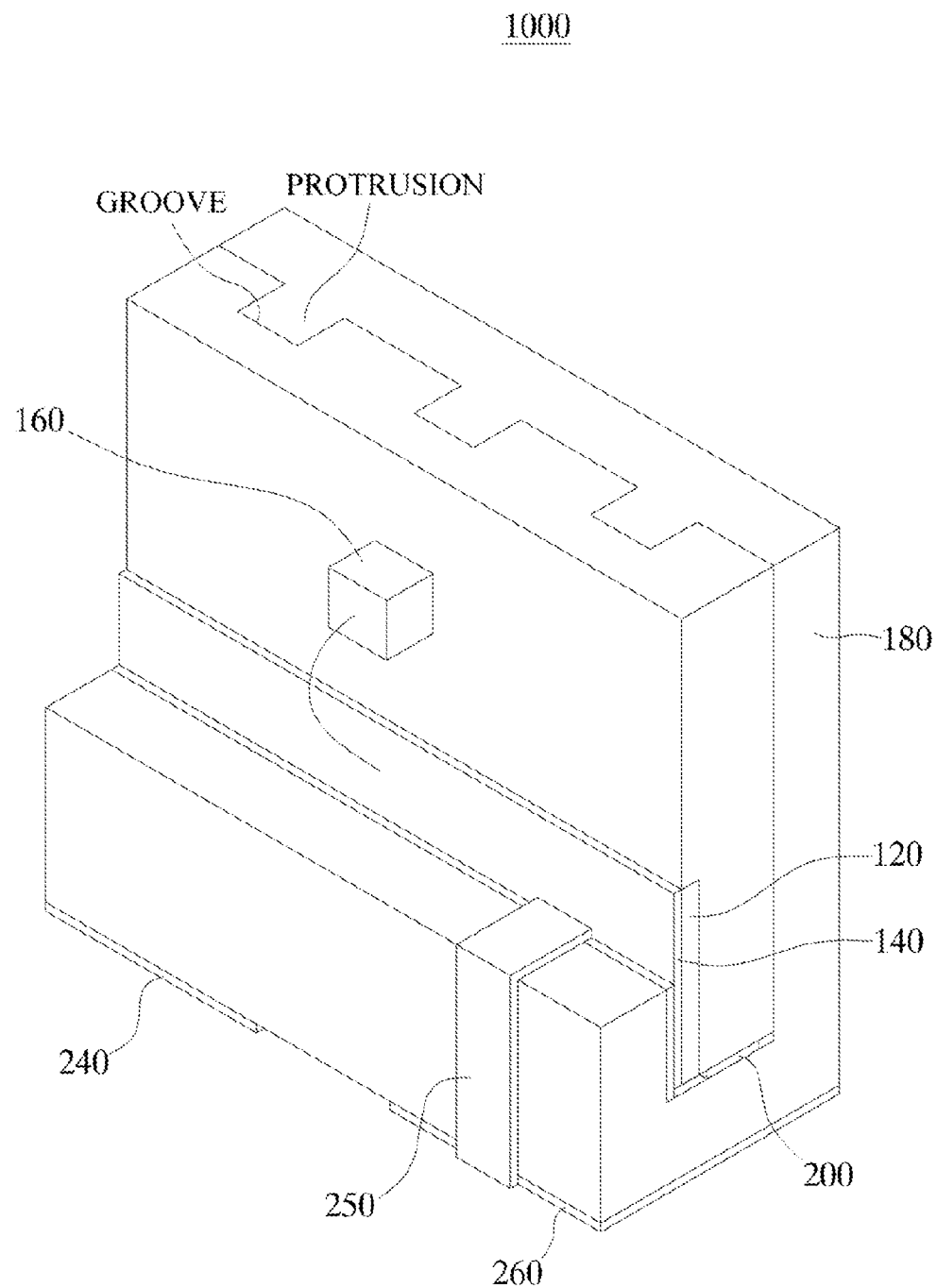
FIG. 7A is a first example illustrating the contact between a conductive substrate and a heat sink of the LED package according to the embodiments of the present invention.
Figure 7B:
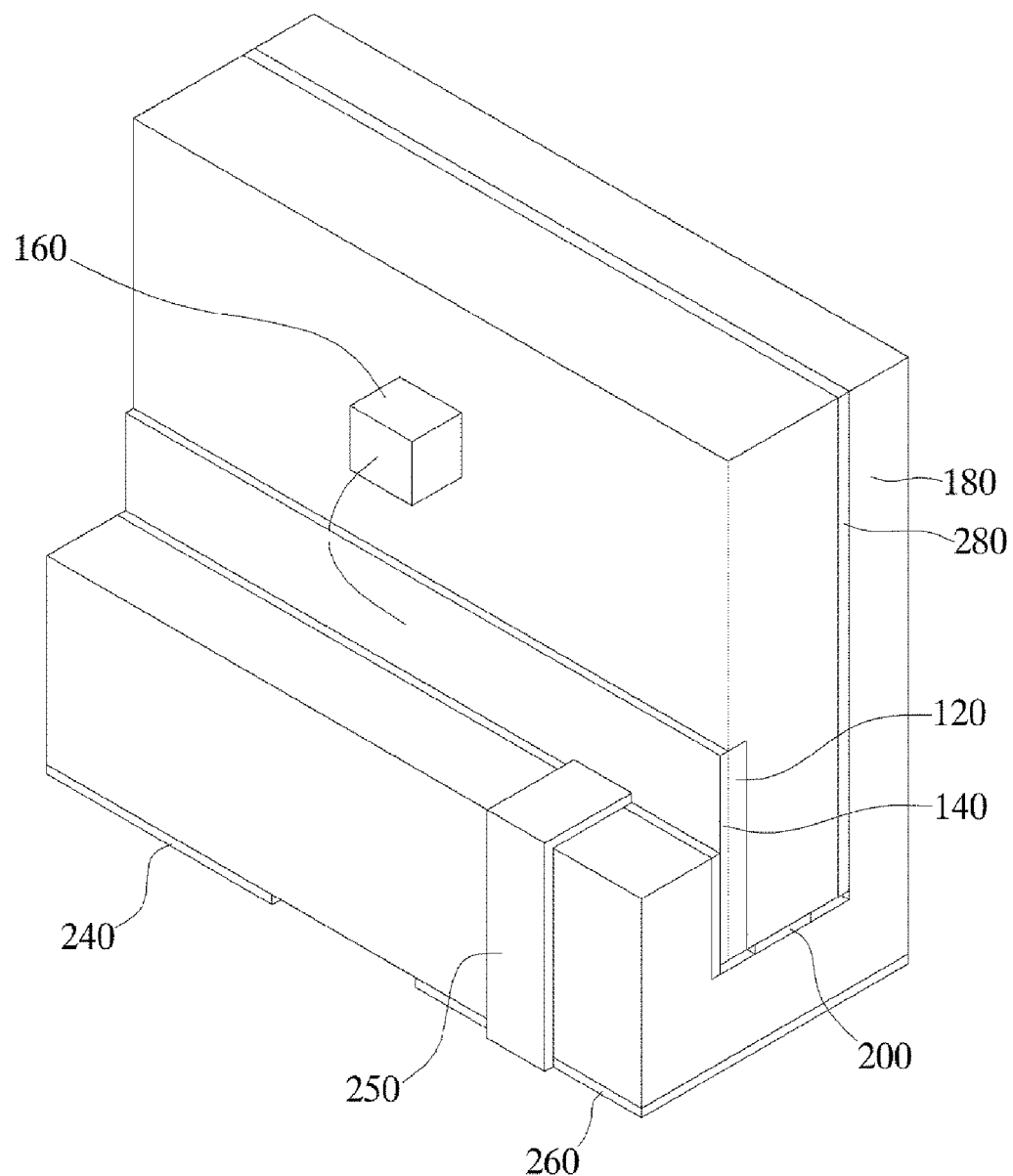
FIG. 7B is a second example illustrating the contact between a conductive substrate and a heat sink of the LED package according to the embodiments of the present invention.

FIG. 7A is a first example illustrating the contact between a conductive substrate and a heat sink of an LED package according to the embodiments of the present invention, and FIG. 7B is a second example illustrating the contact between a conductive substrate and a heat sink of an LED package according to the embodiments of the present invention.

Referring to FIGS. 7A and 7B, at least one protrusion formed on the second surface of the receiving groove 182 may be inserted into at least one grooves formed in the lower surface of the conductive substrate 100, and thus, the conductive substrate 100 may be coupled with the heat sink 180.

When the side view LED package has the above-structure, an area between the conductive substrate 100 and the heat sink 180 may be increased, and thus, heat generated from the LED 160 may be dissipated more efficiently.

The side view LED package 1000 according to the embodiment of the present invention may further include an adhesive layer 280 configured to couple the conductive substrate 100 to the heat sink 180, and the adhesive layer 280 may be disposed between the lower surface of the conductive substrate 100 and the second surface of the receiving groove 182, thereby coupling the conductive substrate 100 and the heat sink 180.

The adhesive layer 280 may include a thermal interface material (TIM), and thus, the heat generated from the LED 160 may be efficiently transferred to the heat sink 180 through the conductive substrate 100. For example, a thermal interface sheet may be used for the adhesive layer 280.

According to the present invention, heat generated from the LEDs can be efficiently dissipated.

Further, the heat generated from the LEDs can also be dissipated through a conductive substrate and a heat sink as well as a lead frame, and thus, an effect of significantly increasing an area through which the heat is dissipated compared with a conventional LED package can be provided.

It will be apparent to those skilled in the art that various modifications can be made to the above-described exemplary embodiments of the present invention without departing from the spirit or scope of the invention. Thus, it is intended that the present invention covers all such modifications provided they come within the scope of the appended claims and their equivalents.

What is claimed is:

1. A light emitting diode (LED) package comprising:
   a light emitting device including:
      a conductive substrate including an upper surface having a first plane and a second plane stepped from the first plane and having a length in a first direction and a width in a second direction perpendicular to the first direction;
      a first insulating layer formed on the first plane;
      a first electrode layer spaced apart from the second plane and disposed on the first insulating layer; and
      an LED disposed on the second plane and including a first electrode and a second electrode electrically connected to the first electrode layer and the conductive substrate, respectively;
   a heat sink formed by a first surface facing the first electrode layer, a second surface facing a lower surface of the conductive substrate, which faces the upper surface, and parallel with the first surface, and a bottom surface connecting the first surface to the second surface and having a length in the first direction and a width in a third direction perpendicular to the first direction, and including a receiving groove into which at least a portion of the light emitting device is inserted;
   a second electrode layer disposed on the bottom surface and being in contact with a side surface which connects the upper surface of the conductive substrate to the lower surface thereof to be electrically connected to the conductive substrate; and
   a third electrode layer disposed on the first surface and being in contact with the first electrode layer.

2. The LED diode package of claim 1, further comprising:
   a fourth electrode layer disposed on a lower surface of the heat sink which faces the bottom surface, and electrically connected to the second electrode layer; and
   a fifth electrode layer disposed on the lower surface of the heat sink while being spaced apart from the fourth electrode layer, and electrically connected to the third electrode layer.

3. The LED diode package of claim 2, wherein the second electrode layer is disposed along the first direction, and an edge of the second electrode layer parallel with the third direction is connected to an edge of the fourth electrode layer parallel with the third direction.

4. The LED diode package of claim 2, wherein the third electrode layer is disposed along the first direction, and an edge of the third electrode layer parallel with the first direction is connected to an edge of the fifth electrode layer parallel with the first direction.

5. The LED diode package of claim 2, wherein the third electrode layer is disposed on a specific area of the first surface along the first direction, and an edge of the third electrode layer parallel with the first direction is connected to an edge of the fifth electrode layer parallel with the first direction.

6. The LED diode package of claim 1, wherein the first plane extends from a first edge of the upper surface of the conductive substrate along the second direction, and the second plane extends from a second edge of the upper surface which faces the first edge along a direction opposite the second direction, and a width of the first plane along the first direction is smaller than that of the second plane along the first direction.

7. The LED diode package of claim 1, wherein the first plane extends from a third edge of the upper surface of the conductive substrate along the first direction, and the second plane extends from a fourth edge of the upper surface which faces the third edge in a direction opposite the first direction, and a width of the first plane along the first direction is smaller than that of the second plane along the first direction.

8. The LED diode package of claim 1, wherein one or more protrusions formed on a second surface of the receiving groove are received in one or more grooves formed in a lower surface of the conductive substrate, and the lower surface of the conductive substrate faces the second surface of the receiving groove.

9. The LED diode package of claim 1, further comprising an adhesive layer interposed between a second surface of the receiving groove and a lower surface of the conductive substrate, which couples the conductive substrate to the heat sink.

10. The LED diode package of claim 1, wherein the second plane protrudes from the first plane.

11. The LED diode package of claim 1, wherein the conductive substrate includes one or more materials selected from the group consisting of copper, aluminum, a copper alloy, and an aluminum alloy.

12. The LED diode package of claim 1, wherein the first insulating layer includes an organic insulating material or an inorganic insulating material.

13. The LED diode package of claim 1, wherein an area of the first insulating layer is greater than that of the first electrode layer.

14. An LED package comprising:
a light emitting device including:
a conductive substrate including an upper surface having a first plane and a second plane stepped from the first plane and having a length in a first direction and a width in a second direction perpendicular to the first direction;
a first insulating layer formed on the first plane;
a first electrode layer spaced apart from the second plane and disposed on the first insulating layer; and
a plurality of LEDs spaced apart from each other on the second plane along the first direction, and each including a first electrode and a second electrode electrically connected to the first electrode layer and the conductive substrate, respectively;
a heat sink formed by a first surface facing the first electrode layer, a second surface facing a lower surface of the conductive substrate, which faces the upper surface, and parallel with the first surface, and a bottom surface connecting the first surface to the second surface and having a length in the first direction and a width in a third direction perpendicular to the first direction, and including a receiving groove into which at least a portion of the light emitting device is inserted;
a second electrode layer disposed on the bottom surface and being in contact with a side surface which connects the upper surface of the conductive substrate to the lower surface thereof to be electrically connected to the conductive substrate; and
a third electrode layer disposed on the first surface and being in contact with the first electrode layer.

15. The LED diode package of claim 14, further comprising:
a fourth electrode layer disposed on a lower surface of the heat sink which faces the bottom surface, and electrically connected to the second electrode layer; and
a fifth electrode layer disposed on the lower surface of the heat sink while being spaced apart from the fourth electrode layer, and electrically connected to the third electrode layer.

16. The LED diode package of claim 15, wherein the second electrode layer is disposed along the first direction, and an edge of the second electrode layer parallel with the third direction is connected to an edge of the fourth electrode layer parallel with the third direction.

17. The LED diode package of claim 15, wherein the third electrode layer is disposed along the first direction, and an edge of the third electrode layer parallel with the first direction is connected to an edge of the fifth electrode layer parallel with the first direction.

18. The LED diode package of claim 14, wherein the first plane extends from a first edge of the upper surface of the conductive substrate along the second direction, and the second plane extends from a second edge of the upper surface which faces the first edge along a direction opposite the second direction, and a width of the first plane along the first direction is smaller than that of the second plane along the first direction.

19. A light emitting diode (LED) package comprising:
a light emitting device including:
a conductive substrate including an upper surface having a first plane and a second plane stepped from the first plane and having a length in a first direction and a width in a second direction perpendicular to the first direction;
a first insulating layer formed on the first plane;
a first electrode layer spaced apart from the second plane and disposed on the first insulating layer; and
a plurality of LEDs spaced apart from each other on the second plane along the second direction, and each including a first electrode and a second electrode electrically connected to the first electrode layer and the conductive substrate, respectively;
a heat sink formed by a first surface facing the first electrode layer, a second surface facing a lower surface of the conductive substrate, which faces the upper surface, and parallel with the first surface, and a bottom surface connecting the first surface to the second surface and having a length in the first direction and a width in a third direction perpendicular to the first direction, and including a receiving groove in which at least a portion of the light emitting device is inserted;
a second electrode layer disposed on the bottom surface and being in contact with a side surface which connects the upper surface of the conductive substrate to the lower surface thereof to be electrically connected to the conductive substrate; and
a third electrode layer disposed on the first surface and being in contact with the first electrode layer.

20. The LED diode package of claim 19, further comprising:
a fourth electrode layer disposed on a lower surface of the heat sink which faces the bottom surface, and electrically connected to the second electrode layer; and
a fifth electrode layer disposed on the lower surface of the heat sink while being spaced apart from the fourth electrode layer, and electrically connected to the third electrode layer.

21. The LED diode package of claim 20, wherein the second electrode layer is disposed along the first direction, and an edge of the second electrode layer parallel with the third direction is connected to an edge of the fourth electrode layer parallel with the third direction.

22. The LED diode package of claim 20, wherein the third electrode layer is disposed along the first direction, and an edge of the third electrode layer parallel with the first direction is connected to an edge of the fifth electrode layer parallel with the first direction.

23. The LED diode package of claim 19, wherein the first plane extends from a third edge of the upper surface of the conductive substrate along the first direction, and the second plane extends from a fourth edge of the upper surface which faces the third edge along a direction opposite the first direction, and a width of the first plane along the first direction is smaller than that of the second plane along the first direction.

* * * * *